(12) United States Patent
Long et al.

(10) Patent No.: US 11,631,451 B2
(45) Date of Patent: Apr. 18, 2023

(54) SEMICONDUCTOR MEMORY TRAINING METHODS AND RELATED DEVICES

(71) Applicant: CHANGXIN MEMORY TECHNOLOGIES, INC., Anhui (CN)

(72) Inventors: Guangteng Long, Hefei (CN); Xiaofeng Xu, Hefei (CN); Junwei Lian, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 121 days.

(21) Appl. No.: 17/310,800

(22) PCT Filed: Mar. 9, 2021

(86) PCT No.: PCT/CN2021/079808
§ 371 (c)(1),
(2) Date: Aug. 24, 2021

(87) PCT Pub. No.: WO2021/190298
PCT Pub. Date: Sep. 30, 2021

(65) Prior Publication Data
US 2022/0319568 A1 Oct. 6, 2022

(30) Foreign Application Priority Data
Mar. 25, 2020 (CN) .......................... 202010219422.3

(51) Int. Cl.
*G11C 11/4072* (2006.01)
*G11C 11/4096* (2006.01)
*G11C 29/56* (2006.01)

(52) U.S. Cl.
CPC ...... *G11C 11/4072* (2013.01); *G11C 11/4096* (2013.01); *G11C 29/56004* (2013.01)

(58) Field of Classification Search
CPC .................................................. G11C 11/4072
See application file for complete search history.

(56) References Cited

U.S. PATENT DOCUMENTS 6,693,828 B1 * 2/2004 Blyth ..................... G11C 16/28
365/185.2
8,760,946 B2    6/2014 Dearth et al.
(Continued)

FOREIGN PATENT DOCUMENTS

CN    108010558 A    5/2018
CN    108039189 A    5/2018

*Primary Examiner* — Douglas King
(74) *Attorney, Agent, or Firm* — Syncoda LLC; Feng Ma

(57) ABSTRACT

A semiconductor memory training method includes: selecting two adjacent reference voltages from a plurality of reference voltages as a first reference voltage and a second reference voltage; obtaining a first minimum margin value for the plurality of target signal lines under the first reference voltage; obtaining a second minimum margin value for the plurality of target signal lines under the second reference voltage, according to a minimum margin value for each target signal line under the second reference voltage; determining a target interval for an expected margin value according to the first minimum margin value and the second minimum margin value, the expected margin value being the maximum one among the minimum margin values for the plurality of target signal lines under the plurality of reference voltages; and searching for the expected margin value in the target interval.

20 Claims, 10 Drawing Sheets

(56) References Cited

U.S. PATENT DOCUMENTS

2012/0284576 A1    11/2012   Housty et al.
2017/0178703 A1     6/2017   Bialas, Jr. et al.

\* cited by examiner

SEMICONDUCTOR MEMORY TRAINING METHODS AND RELATED DEVICES

CROSS-REFERENCE TO RELATED APPLICATIONS

This application is a national stage of International Application No. PCT/CN2021/079808 filed on Mar. 9, 2021, which claims priority to Chinese Patent Application No. 202010219422.3 filed on Mar. 25, 2020. The disclosures of these applications are hereby incorporated by reference in their entirety.

TECHNICAL FIELD

The present application relates to the technical field of semiconductors, and in particular, to a semiconductor memory training method, a semiconductor memory training apparatus, an electronic device, and a computer-readable storage medium.

BACKGROUND

The current semiconductor memories need to be trained to meet normal operating requirements. The training of semiconductor memories is an indispensable part of the system startup stage. There are many training types for semiconductor memories, for example CA (Command Address) training, write training, etc.

For each training type, it is necessary to find out the margin of the maximum operating range within a certain voltage range. The speed of training determines the speed of system startup.

It is to be noted that the information disclosed in the background section is only provided to facilitate the understanding of the background of the present disclosure, and therefore may include information that does not constitute the existing technologies known to a person of ordinary skill in the art.

SUMMARY

The purpose of the present disclosure is to provide a semiconductor memory training method, a semiconductor memory training apparatus, an electronic device and a computer-readable storage medium, which can reduce the time for training semiconductor memories, in order to overcome the above-mentioned shortcomings in the prior art.

According to an aspect of the present disclosure, there is provided a semiconductor memory training method. The semiconductor memory comprises a plurality of target signal lines, each target signal line having a plurality of reference voltages within a target voltage reference range. The method comprises: selecting two adjacent reference voltages from the plurality of reference voltages as a first reference voltage and a second reference voltage; obtaining a first minimum margin value for the plurality of target signal lines under the first reference voltage, according to a minimum margin value for each target signal line under the first reference voltage; obtaining a second minimum margin value for the plurality of target signal lines under the second reference voltage, according to a minimum margin value for each target signal line under the second reference voltage; determining a target interval for an expected margin value according to the first minimum margin value and the second minimum margin value, the expected margin value being the maximum value among the minimum margin values for the plurality of target signal lines under the plurality of reference voltages; and searching for the expected margin value in the target interval, to determine a reference voltage corresponding to the expected margin value as a training result of the semiconductor memory.

According to an aspect of the present disclosure, there is provided a semiconductor memory training apparatus. The semiconductor memory comprises a plurality of target signal lines, each target signal line having a plurality of reference voltages within the target voltage reference range. The apparatus comprises: a reference voltage selection unit, configured to select two adjacent reference voltages from the plurality of reference voltages as a first reference voltage and a second reference voltage; a first margin obtaining unit, configured to obtain first minimum margin value for the plurality of target signal lines under the first reference voltage according to a minimum margin value for each target signal line under the first reference voltage; a second margin obtaining unit, configured to obtain a second minimum margin value for the plurality of target signal lines under the second reference voltage according to a minimum margin value for each target signal line under the second reference voltage; a target interval determination unit, configured to determine a target interval for an expected margin value according to the first minimum margin value and the second minimum margin value, the expected margin value being the maximum value among the minimum margin values for the plurality of target signal lines under the plurality of reference voltages; and an expected margin searching unit, configured to search for the expected margin value in the target interval to determine a reference voltage corresponding to the expected margin value as the training result of the semiconductor memory.

According to an aspect of the present disclosure, there is provided an electronic device, comprising: one or more processors; and a storage apparatus, configured to store one or more programs; the one or more programs cause, when executed by the one or more processors, the one or more processors to implement the method in any embodiment of the present disclosure.

According to an aspect of the present disclosure, there is provided a computer-readable storage medium having computer programs stored thereon that, when executed by a processor, cause the processor to implement the method in any embodiment of the present disclosure.

With regard to the semiconductor memory training method, the semiconductor memory training apparatus, the electronic device, and the computer-readable storage medium in some embodiments of the present disclosure, by selecting, from a plurality of reference voltages for each target signal line in the target voltage reference range, two adjacent reference voltages as a first reference voltage and a second reference voltage, obtaining a first minimum margin value for the plurality of target signal lines under the first reference voltage according to a minimum margin value for each target signal line under the first reference voltage, and obtaining a second minimum margin value for the plurality of target signal lines under the second reference voltage according to a minimum margin value for each target signal line under the second reference voltage, the target interval for an expected margin value may be determined according to the first minimum margin value and the second minimum margin value, and then the expected margin value may be searched in the target interval to determine a reference voltage corresponding to the expected margin value as the training result of the semiconductor memory. That is, the search range of the expected margin value is reduced by the target interval. This can improve the search efficiency of the expected margin value, thereby improving the training efficiency of semiconductor memories and reducing the time used for training. Therefore, the speed of system startup may be increased.

It should be understood that the aforementioned general description and following detailed description are merely exemplary and explanatory, and the present disclosure is not limited thereto.

BRIEF DESCRIPTION OF THE DRAWINGS

The drawings herein are incorporated into the specification and constitute a part of the specification. The drawings show embodiments of the present disclosure, and explain, together with the specification, the principle of the present disclosure. Apparently, the drawings to be used in the following description show only some embodiments of the present disclosure. For a person of ordinary skill in the art, other drawings may be obtained according to these drawings, without paying any creative effort.

DETAILED DESCRIPTION

Figure 1:
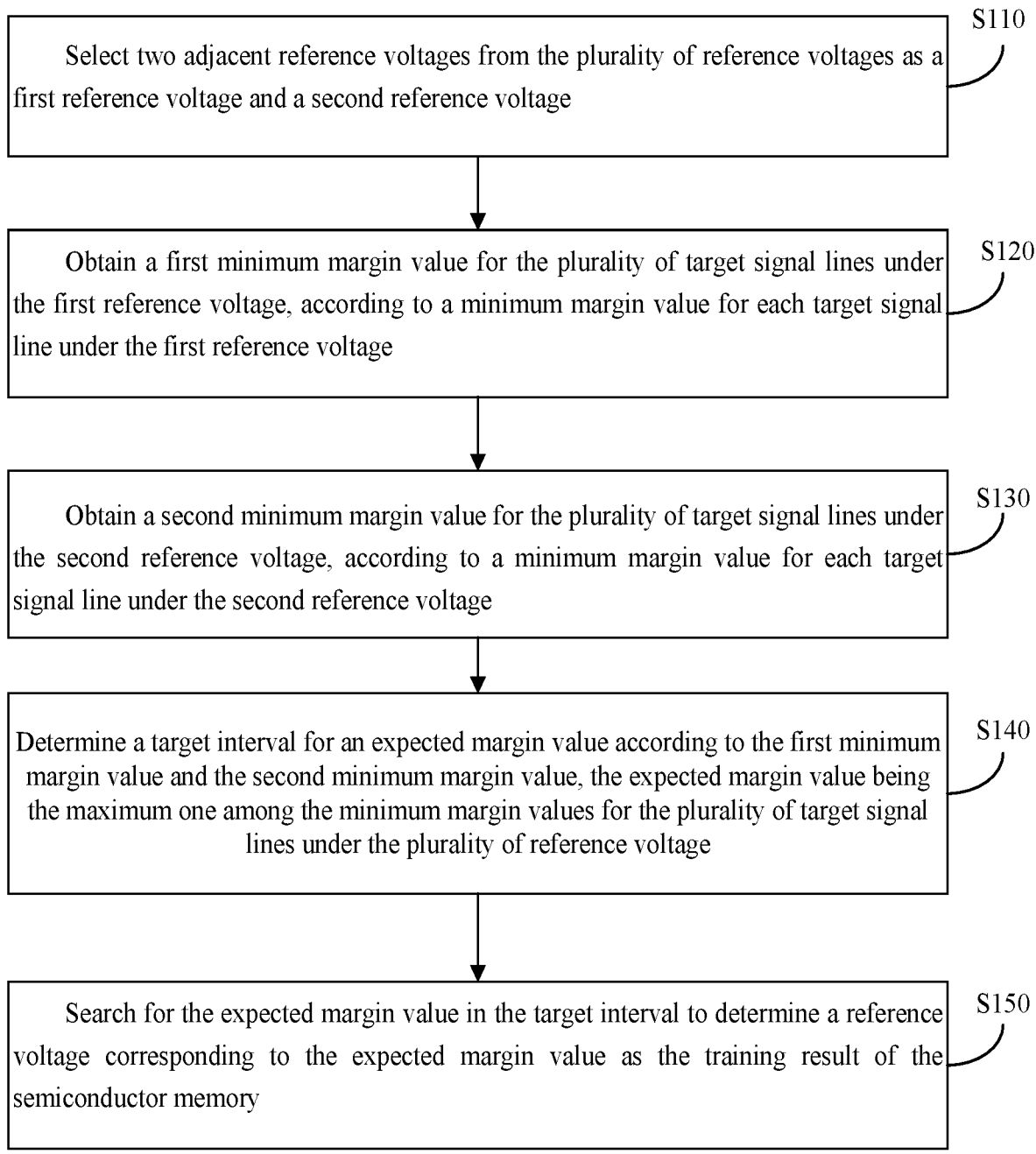
FIG. 1 schematically shows a flowchart of a semiconductor memory training method according to an embodiment of the present disclosure.

Exemplary implementations will now be described more fully with reference to the accompanying drawings. However, the exemplary implementations may be implemented in various forms, and should not be construed as being limited to the examples set forth herein; instead, these implementations are provided to make the present disclosure more comprehensive and complete, and to fully convey the concepts of the exemplary implementations to those skilled in the art.

In addition, the described features, structures or characteristics may be combined in one or more embodiments in any suitable way. In the following description, many specific details are provided to give a sufficient understanding of the embodiments of the present disclosure. However, it will be realized by those skilled in the art that the technical solutions of the present disclosure may be practiced without one or more of the specific details, or other methods, components, apparatuses, steps, etc. may be used. In other cases, the well-known methods, apparatuses, implementations or operations will not be shown or described in detail in order to avoid obscuring aspects of the present disclosure.

The block diagrams shown in the drawings are merely functional entities, and do not necessarily correspond to physically independent entities. That is, these functional entities may be implemented in the form of software, or implemented in one or more hardware modules or integrated circuits, or implemented in different networks and/or processor apparatuses and/or microcontroller apparatuses.

The flowchart shown in the drawings is merely an exemplary description, and does not necessarily comprise all contents and operations/steps, nor does it have to be executed in the described order. For example, some operations/steps may be decomposed, and some operations/steps may be combined or partially combined, so the actual execution order may be changed according to actual conditions.

Although relative terms such as "upper" and "lower" are used in this specification to describe the relative relationship between one component and another component, these terms are used in this specification just for convenience, for example, in the direction as shown in the drawings. It may be understood that, if an apparatus as shown is turned upside down, the component described as "upper" will become the "lower" component. When a structure is arranged "on" other structures, it may mean that the structure is integrally formed on the other structures, or that the structure is "directly" arranged on the other structures, or that the structure is "indirectly" arranged on the other structures through another structure.

The terms "a", "an", "the", "said" and "at least one" are used to indicate the presence of one or more elements/constituent parts/etc.; the terms "comprising" and "having" are used to indicate non-exclusive inclusion and indicate the presence of other elements/constituent parts/etc. in addition to the listed elements/constituent parts/etc.; and the terms "first" and "second" are used only as marks, rather than limiting the number of objects.

Due to the increase in the operating frequency of semiconductor memories, the range of fault tolerance between signals has become very small. If the signals are not trained to meet the corresponding delay requirements, the semiconductor memories cannot operate normally. The training of semiconductor memories is an indispensable part of the initialization of semiconductor memories. Before the training is completed, the semiconductor memories cannot be initialized, and the system data and codes cannot be loaded to the semiconductor memories. Therefore, the speed of training semiconductor memories determines the speed of system startup.

FIG. 1 schematically shows a flowchart of a semiconductor memory training method according to an embodiment of the present disclosure. In an embodiment of the present disclosure, the semiconductor memories may be any type of semiconductor memories, for example, DDR SDRAMs (Double Data Rate Synchronous Dynamic Random-Access Memories). In the following examples, LPDDR 4 (Low Power DDR SDRAM) will be used as an example for illustration. However, the present disclosure is not limited thereto, and the semiconductor memories may be any type of memories.

In an embodiment of the present disclosure, the semiconductor memory may comprise a plurality of target signal lines, and each target signal line may have a plurality of reference voltages within a target voltage reference range.

The target signal lines in an embodiment of the present disclosure may be, for example, any one or more of command signal lines (CA signal lines for short, which correspond to CA signals), data signal lines (which correspond to data signals), etc., of a semiconductor memory. In the following examples, six CA signal lines (labeled as CA0-CA5) of LPDDR 4 are taken as examples of the plurality of target signal lines. The training process of other signal lines is similar.

The command or data signals have a corresponding voltage reference range. For example, it is stipulated in the JEDEC (Joint Electron Device Engineering Council) standard that the LPDDR4 CA signals has two voltage reference ranges: Range[0]: 10.0%-30.0% of $V_{DD2}$, and Range[1]: 22.0%-42.0% of $V_{DD2}$, both having a step size of 0.4%. The two voltage reference ranges overlap partially, as shown in Table 1. That is, the two ranges have total 81 reference voltages (102 (total)−21(overlapped)=81).

In the following examples, the description will be given by using, as an example, the Range[0] and Range[1] as the target voltage reference ranges and the 81 reference voltages in the two ranges as the plurality of reference voltages. However, it should be noted that different protocols have different voltage reference ranges and step sizes. Therefore, the embodiments of the present disclosure are not limited to the above examples.

In the related art, in the training process, the minimum margin values for all CA signals under each reference voltage are first obtained, and then the maximum value among these minimum margin values is obtained under all reference voltages.

For example, for each CA signal in the 6 CA signal lines, it is necessary to test the margin under 81 reference voltages in sequence. It is assumed that the initial margin range is 0-1023 and that the operating margin range of a CA signal line that is currently tested is actually [104,706], where 104 is the left margin value and 706 is the right margin value, then the process of obtaining the operating margin range of this CA signal line under a reference voltage comprises: starting from 0, adding the margin by 1 each time to determine whether this CA signal line can operate normally. It is found that this CA signal line can still operate normally when the margin 706 is tested, but this CA signal line cannot operate normally when the margin 707 is tested. Therefore, a total of the right margin value+2=708 determinations are required to determine that the right margin value for this CA signal line is 706. Among them, the sum of time required for "right margin value+2" determinations is the test time to obtain the operating margin range for this CA signal line.

By this method, the test time of each of 6 CA signal lines under 81 reference voltages is calculated respectively, and then the 6*81 test time is accumulated to obtain the total test

TABLE 1

| Function | Operand | Range[0] Values(% of $V_{DD2}$) | | Range[1] Values(% of $V_{DD2}$) | |
|---|---|---|---|---|---|
| Set the $V_{REF}$ for MR12 | OP[5:0] | $000000_B$: 10.0% | $011010_B$: 20.4% | $000000_B$: 22.0% | $011010_B$: 32.4% |
| | | $000001_B$: 10.4% | $011011_B$: 20.8% | $000001_B$: 22.4% | $011011_B$: 32.8% |
| | | $000010_B$: 10.8% | $011100_B$: 21.2% | $000010_B$: 22.8% | $011100_B$: 33.2% |
| | | $000011_B$: 11.2% | $011101_B$: 21.6% | $000011_B$: 23.2% | $011101_B$: 33.6% |
| | | $000100_B$: 11.6% | $011110_B$: 22.0% | $000100_B$: 23.6% | $011110_B$: 34.0% |
| | | $000101_B$: 12.0% | $011111_B$: 22.4% | $000101_B$: 24.0% | $011111_B$: 34.4% |
| | | $000110_B$: 12.4% | $100000_B$: 22.8% | $000110_B$: 24.4% | $100000_B$: 34.8% |
| | | $000111_B$: 12.8% | $100001_B$: 23.2% | $000111_B$: 24.8% | $100001_B$: 35.2% |
| | | $001000_B$: 13.2% | $100010_B$: 23.6% | $001000_B$: 25.2% | $100010_B$: 35.6% |
| | | $001001_B$: 13.6% | $100011_B$: 24.0% | $001001_B$: 25.6% | $100011_B$: 36.0% |
| | | $001010_B$: 14.0% | $100100_B$: 24.4% | $001010_B$: 26.0% | $100100_B$: 36.4% |
| | | $001011_B$: 14.4% | $100101_B$: 24.8% | $001011_B$: 26.4% | $100101_B$: 36.8% |
| | | $001100_B$: 14.8% | $100110_B$: 25.2% | $001100_B$: 26.8% | $100110_B$: 37.2% |
| | | $001101_B$: 15.2% | $100111_B$: 25.6% | $001101_B$: 27.2% (defaulted) | $100111_B$: 37.6% |
| | | $001110_B$: 15.6% | $101000_B$: 26.0% | $001110_B$: 27.6% | $101000_B$: 38.0% |
| | | $001111_B$: 16.0% | $101001_B$: 26.4% | $001111_B$: 28.0% | $101001_B$: 38.4% |
| | | $010000_B$: 16.4% | $101010_B$: 26.8% | $010000_B$: 28.4% | $101010_B$: 38.8% |
| | | $010001_B$: 16.8% | $101011_B$: 27.2% | $010001_B$: 28.8% | $101011_B$: 39.2% |
| | | $010010_B$: 17.2% | $101100_B$: 27.6% | $010010_B$: 29.2% | $101100_B$: 39.6% |
| | | $010011_B$: 17.6% | $101101_B$: 28.0% | $010011_B$: 29.6% | $101101_B$: 40.0% |
| | | $010100_B$: 18.0% | $101110_B$: 28.4% | $010100_B$: 30.0% | $101110_B$: 40.4% |
| | | $010101_B$: 18.4% | $101111_B$: 28.8% | $010101_B$: 30.4% | $101111_B$: 40.8% |
| | | $010110_B$: 18.8% | $110000_B$: 29.2% | $010110_B$: 30.8% | $110000_B$: 41.2% |
| | | $010111_B$: 19.2% | $110001_B$: 29.6% | $010111_B$: 31.2% | $110001_B$: 41.6% |
| | | $011000_B$: 19.6% | $110010_B$: 30.0% | $011000_B$: 31.6% | $110010_B$: 42.0% |
| | | $011001_B$: 20.0% | All others: reserved | $011001_B$: 32.0% | All others: reserved |

In an embodiment of the present disclosure, it is assumed that the currently tested semiconductor memory has 6 command signal lines and 8 or 16 data signal lines (which may be different for different protocols). In CA training, it is necessary to obtain a maximum value (that is, the expected margin value) among minimum values in the operating margin range of the six command signal lines CA0-CA5 under each reference voltage (for example, minimum margin values for the six command signal lines under the 81 reference voltages). It is two-dimensional because there are two variables: the voltage reference range and the operating margin value.

time of the 6 CA signal lines. From this, it may be known that the training method used in the related technologies has a very large amount of calculation, which will lead to long training time that in turn affects the speed of system startup.

The embodiment of the present disclosure improves the test method in the related technologies, mainly comprising two major steps. The first step is to improve the method for obtaining the operating margin range of each target signal line; and the second step is to improve the method for obtaining the maximum value among the minimum margin values for all target signal lines under all reference voltages. They will be explained separately below.

As shown in FIG. 1, the semiconductor memory training method according to an embodiment of the present disclosure may comprise the following steps.

In the step S110, two adjacent reference voltages are selected from the plurality of reference voltages as a first reference voltage and a second reference voltage.

For example, any one of the 81 reference voltages may be selected as a first reference voltage. When the first reference voltage is not the maximum reference voltage and the minimum reference voltage among the 81 reference voltages, another reference voltage on the left of and adjacent to the first reference voltage may be selected as a second reference voltage, or another reference voltage on the right of and adjacent to the first reference voltage may be selected as a second reference voltage. In the following examples, the description will be given by using the middle reference voltage (labeled as midVref) among the 81 reference voltages as the first reference voltage and the midVref-1 reference voltage as the second reference voltage. However, the present disclosure is not limited thereto.

In the step S120, a first minimum margin value for the plurality of target signal lines under the first reference voltage is obtained according to a minimum margin value for each target signal line under the first reference voltage.

For example, the operating margin range of each of CA signal lines CA0-CA5 under each of the 81 reference voltages is obtained. It is assumed that the operating margin range of the $i^{th}$ CA signal line under the $j^{th}$ reference voltage is [leftVal$_{ij}$, rightVal$_{ij}$], where i is an integer from 0 to 5, j is an integer from 0 to 80, leftVal$_{ij}$ is the left margin value (minimum margin value) of the $i^{th}$ CA signal line under the $j^{th}$ reference voltage, rightVal$_{ij}$ is the right margin value (maximum margin value) of the $i^{th}$ CA signal line under the $j^{th}$ reference voltage, and also assumed that the $k^{th}$ (k is any integer from 1 to 79) reference voltage (for example, the midVref, k=40) is used as the first reference voltage, then the first minimum margin value for CA0-CA5 under the first reference voltage is minVal$_k$=in(leftVal$_{0k}$, leftVal$_{1k}$, leftVal$_{2k}$, leftVal$_{3k}$, leftVal$_{4k}$, leftVal$_{5k}$).

In the step S130, a second minimum margin value for the plurality of target signal lines under the second reference voltage is obtained according to a minimum margin value for each target signal line under the second reference voltage.

For example, it is assumed that the second reference voltage is the $(k-1)^{th}$ reference voltage, the second minimum margin value for CA0-CA5 under the second reference voltage is curVal$_{(k-1)}$=min(leftVal$_{0(k-1)}$, leftVal$_{1(k-1)}$, leftVal$_{2(k-1)}$, leftVal$_{3(k-1)}$, leftVal$_{4(k-1)}$, leftVal$_{5(k-1)}$).

For another example, if the $(k+1)^{th}$ reference voltage is selected as the second reference voltage, the second minimum margin value for CA0-CA5 under the second reference voltage is curVal$_{(k+1)}$=min(leftVal$_{0(k+1)}$, leftVal$_{1(k+1)}$, leftVal$_{2(k+1)}$, leftVal$_{3(k+1)}$, leftVal$_{4(k+1)}$, leftVal$_{5(k+1)}$).

In the step S140, a target interval is determined for an expected margin value according to the first minimum margin value and the second minimum margin value, the expected margin value being the maximum value among the minimum margin values for the plurality of target signal lines under the plurality of reference voltages.

For example, the expected margin value is the maximum margin value among the minimum margin values for CA0-CA5 under 81 reference voltages. That is, it is assumed that the minimum margin value for CA0-CA5 under the $j^{th}$ reference voltage is curVal$_j$=min(leftVal$_{0j}$, leftVal$_{1j}$, leftVal$_{2j}$, leftVal$_{3j}$, leftVal$_{4j}$, leftVal$_{5j}$), the expected margin value is max(curVal$_0$, curVal$_1$, curVal$_2$, curVal$_3$, curVal$_4$, curVal$_5$, curVal$_6$, curVal$_7$, curVal$_8$, ..., curVal$_{80}$). Note that, this refers to the meaning of the expected margin value, not the manner in which the expected margin value is obtained in the embodiments of the present disclosure.

In the step S150, the expected margin value is searched in the target interval to determine a reference voltage corresponding to the expected margin value as the training result of the semiconductor memory.

With regard to the semiconductor memory training method in the implementations of the present disclosure, by selecting, from a plurality of reference voltages for each target signal line in a target voltage reference range, two adjacent reference voltages as a first reference voltage and a second reference voltage, obtaining a first minimum margin value for the plurality of target signal lines under the first reference voltage according to a minimum margin value for each target signal line under the first reference voltage, and obtaining a second minimum margin value for the plurality of target signal lines under the second reference voltage according to a minimum margin value for each target signal line under the second reference voltage, a target interval for an expected margin value may be determined according to the first minimum margin value and the second minimum margin value, and then the expected margin value may be searched in the target interval to determine a reference voltage corresponding to the expected margin value as the training result of the semiconductor memory. That is, the search range of the expected margin value is reduced by the target interval. This can improve the search efficiency of the expected margin value, thereby improving the training efficiency of semiconductor memories and reducing the time used for training. Therefore, the speed of system startup may be increased.

Figure 2:
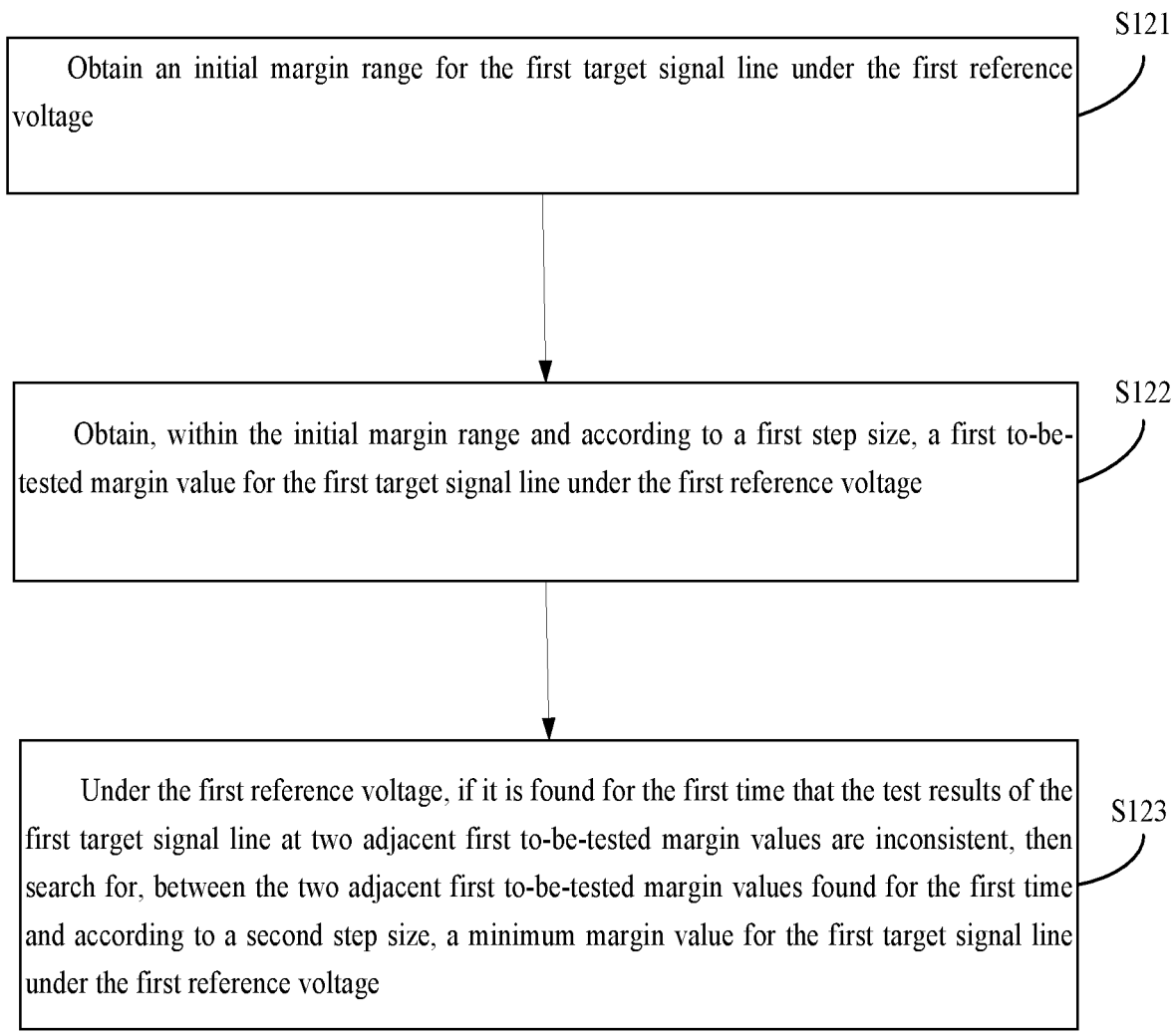
FIG. 2 schematically shows a processing flowchart of the step S120 of FIG. 1 in an exemplary embodiment.

FIG. 2 schematically shows a processing flowchart of the step S120 of FIG. 1 in an exemplary embodiment. In an embodiment of the present disclosure, the plurality of target signal lines may comprise a first target signal line.

For example, taking the above CA0-CA5 as an example, it is assumed that the first target signal line is CA0 (the present disclosure is not limited thereto and the first target signal line may be any one of the plurality of target signal lines), then how to obtain the operating margin range of CA0 under the first reference voltage will be illustrated as an example. The method for obtaining the operating margin range of other target signal lines under various reference voltages may be similar.

As shown in FIG. 2, in an embodiment of the present disclosure, the step S120 may further comprise the following steps.

In the step S121, an initial margin range for the first target signal line under the first reference voltage is obtained.

For example, it is assumed that the initial margin range of CA0 under the middle reference voltage midVref is 0-1023, and that the operating margin range of CA0 under the middle reference voltage midVref is actually [104,706]. It should be noted that this is merely exemplary, and the actual initial margin range and operating margin range may be determined according to actual conditions.

In the step S122, a first to-be-tested margin value for the first target signal line under the first reference voltage is obtained within the initial margin range and according to a first step size.

In an embodiment of the present disclosure, the first step size is represented by N1. That is, the difference between two adjacent margin values is N1. N1 is a positive integer greater than 1. For example, at N1=10 (the present disclosure is not limited thereto and the value of N1 may be set according to actual needs), starting from "0" on the first side of the initial margin range (in the following examples, the first side is used as the left side as an example), the margin is increased according to the first step size of 10 toward the second side of the initial margin range (in the following examples, the second side is used as the right side as an example), a plurality of first to-be-tested margin values for CA0 under the middle reference voltage midVref may be obtained, for example, 0, 10, 20, 30, 40, 50, 60, 70, 80, 90, 100, 110, 120, . . . , 690, 700, 710, . . . , 1010, 1020.

In the step S123, under the first reference voltage, if it is found for the first time that the test results of the first target signal line at two adjacent first to-be-tested margin values are inconsistent, then a minimum margin value for the first target signal line under the first reference voltage is searched between the two adjacent first to-be-tested margin values found for the first time according to a second step size.

For example, starting from the margin value of 0, a determination is made as to whether CA0 can operate normally under the middle reference voltage midVref. If the test result shows that it does not operate normally (i.e., abnormal operation), a determination is made as to whether CA0 can operate normally at the margin value of 10. If the test result is indicative of abnormal operation, a determination is made as to whether CA0 can operate normally at the margin value of 20. This process is repeated until the test result shows that it still cannot operate normally under the middle reference voltage midVref at the margin value of 100. However, CA0 can operate normally under the middle reference voltage midVref at the margin value of 110. That is, it is found for the first time that the test results of CA0 at two adjacent first to-be-tested margin values (100 and 110) are inconsistent (the test result is indicative of normal operation at the margin value of 100 and abnormal operation at the margin value of 110). In this case, it may be determined that the left margin value of the operating margin range of CA0 under the middle reference voltage midVref is between 100 and 110. Therefore, the left margin value of the operating margin range of CA0 under the middle reference voltage midVref may be precisely searched between 100 and 110 according to a second step size M1 that is less than the first step size N1.

In an embodiment of the present disclosure, the second step size M1 is a positive integer greater than or equal to 1, and N1>M1. The less the value of M1 is, the closer the obtained operating margin range of the first target signal line under the first reference voltage is to the actual operating margin range, that is, the more accurate the test result is.

Figure 3:
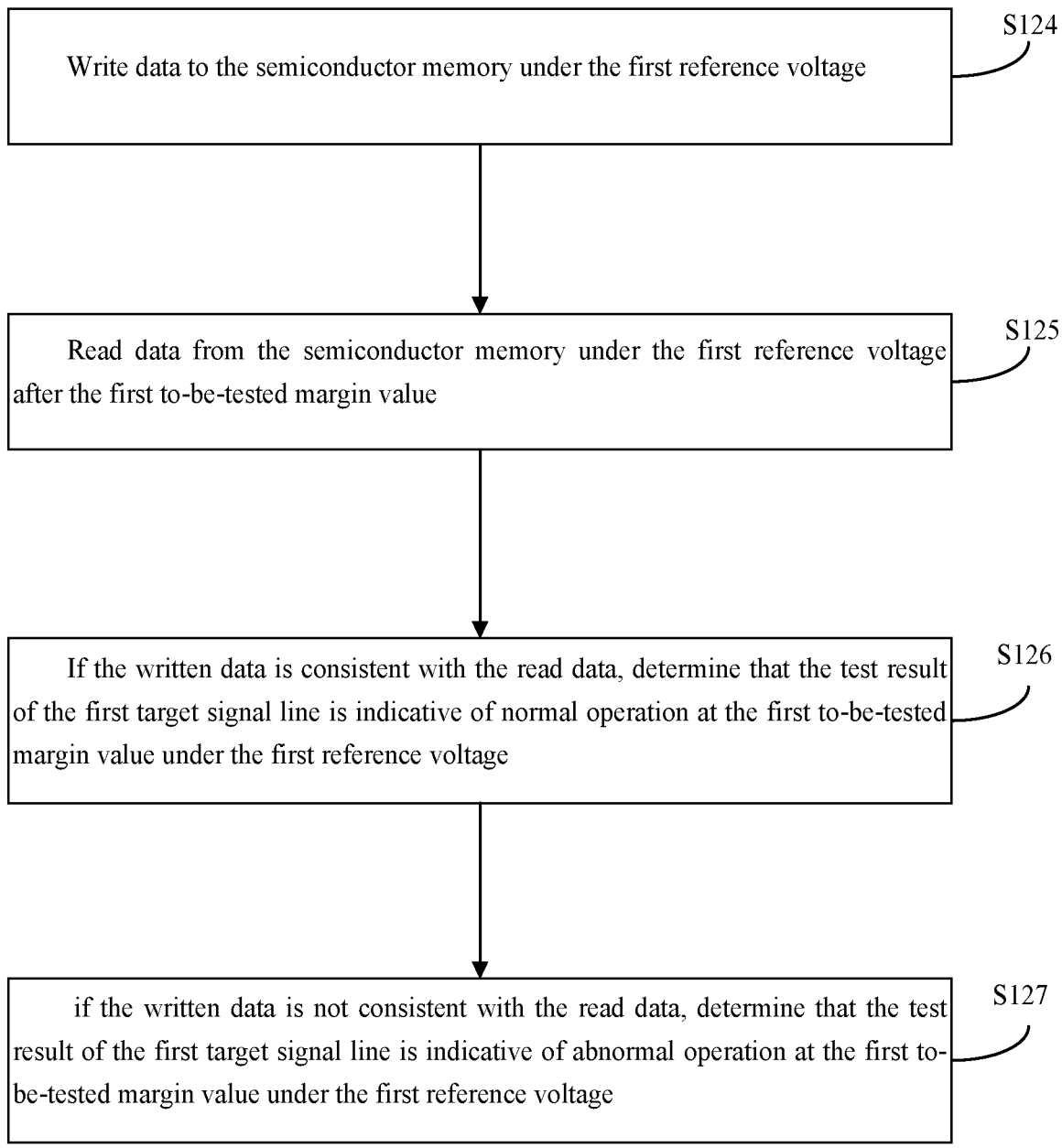
FIG. 3 schematically shows a processing flowchart of the step S120 of FIG. 1 in an exemplary embodiment.

FIG. 3 schematically shows a processing flowchart of the step S120 of FIG. 1 in an exemplary embodiment. As shown in FIG. 3, in an embodiment of the present disclosure, the step S120 may further comprise the following steps.

In the step S124, data is written to the semiconductor memory under the first reference voltage.

How to make a determination as to whether CA0 can operate normally under the middle reference voltage midVref will be illustrated as an example. Under the middle reference voltage midVref, preset data is written to the semiconductor memory that is currently tested.

In the step S125, data is read from the semiconductor memory under the first reference voltage after the first to-be-tested margin value.

Then, the first to-be-tested margin value of 0 is taken as an example. Under the middle reference voltage midVref and after the margin value of 0, the preset data already written is read from the semiconductor memory (the preset data may be any data whose value is known in advance, and the specific value and generation method of data are not limited in the present disclosure).

In the step S126, if the written data is consistent with the read data, it is determined that the test result of the first target signal line is indicative of normal operation at the first to-be-tested margin value under the first reference voltage.

If, under the middle reference voltage midVref, the data read after the margin value of 0 is the same as the preset data already written, it means that CA0 can operate normally at the margin value of 0 under the middle reference voltage midVref.

In the step S127, if the written data is not consistent with the read data, it is determined that the test result of the first target signal line is indicative of normal operation at the first to-be-tested margin value under the first reference voltage.

In contrast, if, under the middle reference voltage midVref, the data read after the margin value of 0 is not the same as the preset data already written, it means that CA0 cannot operate normally at the margin value of 0 under the middle reference voltage midVref.

Then, the test may be performed continuously at the first to-be-tested margin value of 10. Some preset data is written to the semiconductor memory that is currently tested under the middle reference voltage midVref. After the margin value of 10, the preset data already written is read from the semiconductor memory. If, under the middle reference voltage midVref, the data read after the margin value of 10 is the same as the preset data already written, it means that CA0 can operate normally at the margin value of 10 under the middle reference voltage midVref. In contrast, if, under the middle reference voltage midVref, the data read after the margin value of 10 is not the same as the preset data already written, it means that CA0 cannot operate normally at the margin value of 10 under the middle reference voltage midVref. Similarly, test results that indicate whether CA0 can operate normally at first to-be-tested margin values of 0, 10, 20, 30, 40, 50, 60, 70, 80, 90, 100, 110 may be obtained.

Figure 4:
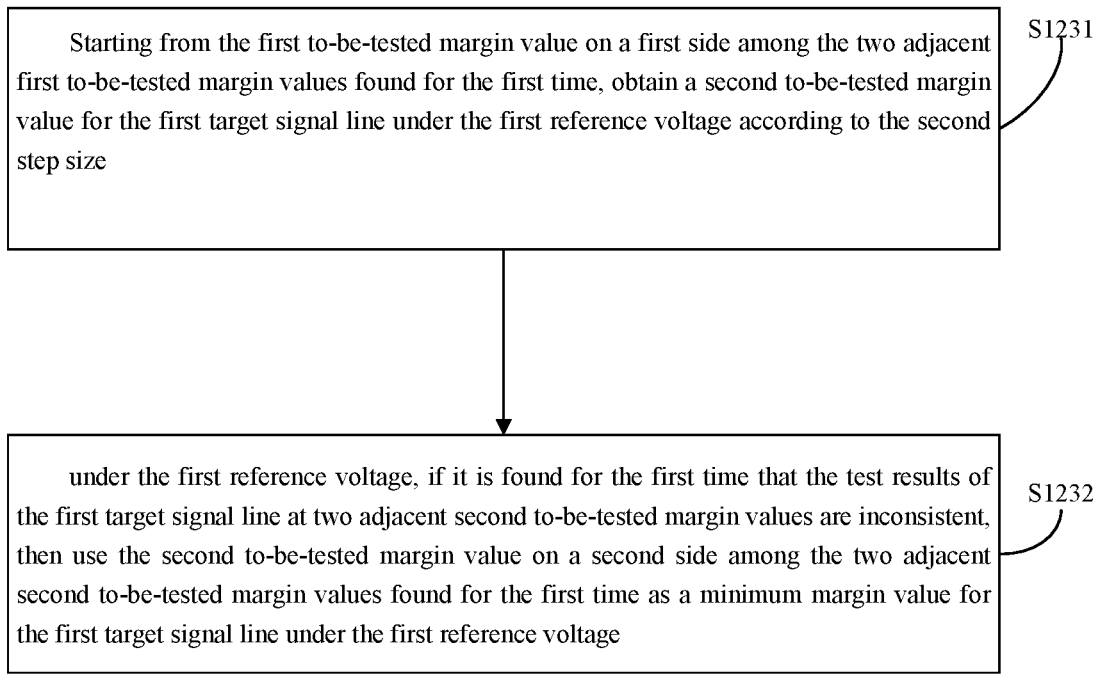
FIG. 4 schematically shows a processing flowchart of the step S123 of FIG. 2 in an exemplary embodiment.

FIG. 4 schematically shows a processing flowchart of the step S123 of FIG. 2 in an exemplary embodiment. As shown in FIG. 4, in an embodiment of the present disclosure, the step S123 may further comprise the following steps.

In the step S1231, starting from the first to-be-tested margin value on a first side among the two adjacent first to-be-tested margin values found for the first time, a second to-be-tested margin value for the first target signal line under the first reference voltage is obtained according to the second step size.

For example, it is assumed that M1=2 (the present disclosure is not limited thereto and M1 may be a positive integer less than N1). Starting from the first to-be-tested margin value of 100 on the left side among the two adjacent first to-be-tested margin values of 100 and 110 found for the first time, the second to-be-tested margin values of 102, 104, 106, 108 for CA0 under the middle reference voltage midVref may be obtained in an increasing order according to the second step size of 2.

In the step S1232, under the first reference voltage, if it is found for the first time that the test results of the first target signal line at two adjacent second to-be-tested margin values are inconsistent, then the second to-be-tested margin value on a second side among the two adjacent second to-be-tested margin values found for the first time is used as a minimum margin value for the first target signal line under the first reference voltage.

Similarly, under the middle reference voltage midVref, preset data is written to the semiconductor memory that is currently tested. Under the middle reference voltage midVref and after the margin value of 102, the preset data already written is read from the semiconductor memory. If, under the middle reference voltage midVref, the data read after the margin value of 102 is the same as the preset data already written, it means that CA0 can operate normally at the margin value of 102 under the middle reference voltage midVref. In contrast, if, under the middle reference voltage midVref, the data read after the margin value of 102 is not the same as the preset data already written, it means that CA0 cannot operate normally at the margin value of 102 under the middle reference voltage midVref. Here, since the left margin value of the actual operating margin range of CA0 under the middle reference voltage midVref is 104, the test result is indicative of abnormal operation at the margin value of 102. Then, a determination is made as to whether CA0 can operate normally at the margin value of 104 under the middle reference voltage midVref. The test result here shows that it can operate normally. That is, it is found for the first time that the test results of CA0 at two adjacent second to-be-tested margin values of 102 and 104 are inconsistent. In this case, the second to-be-tested margin value of 104 on the right side may be used as a minimum margin value for CA0 under the middle reference voltage midVref, i.e., the left margin value obtained by the test.

It should be noted that, in the process of obtaining the minimum margin value for the first target signal line under the first reference voltage, it is not necessary to sequentially test all the first to-be-tested margin values and all the second-to-be-tested margin values. For example, only some of the first to-be-tested margin values in the above example need to be tested, that is, 0, 10, 20, 30, 40, 50, 60, 70, 80, 90, 100, 110, and only some of the second to-be-tested margin values need to be tested, that is, 102 and 104.

Figure 5:
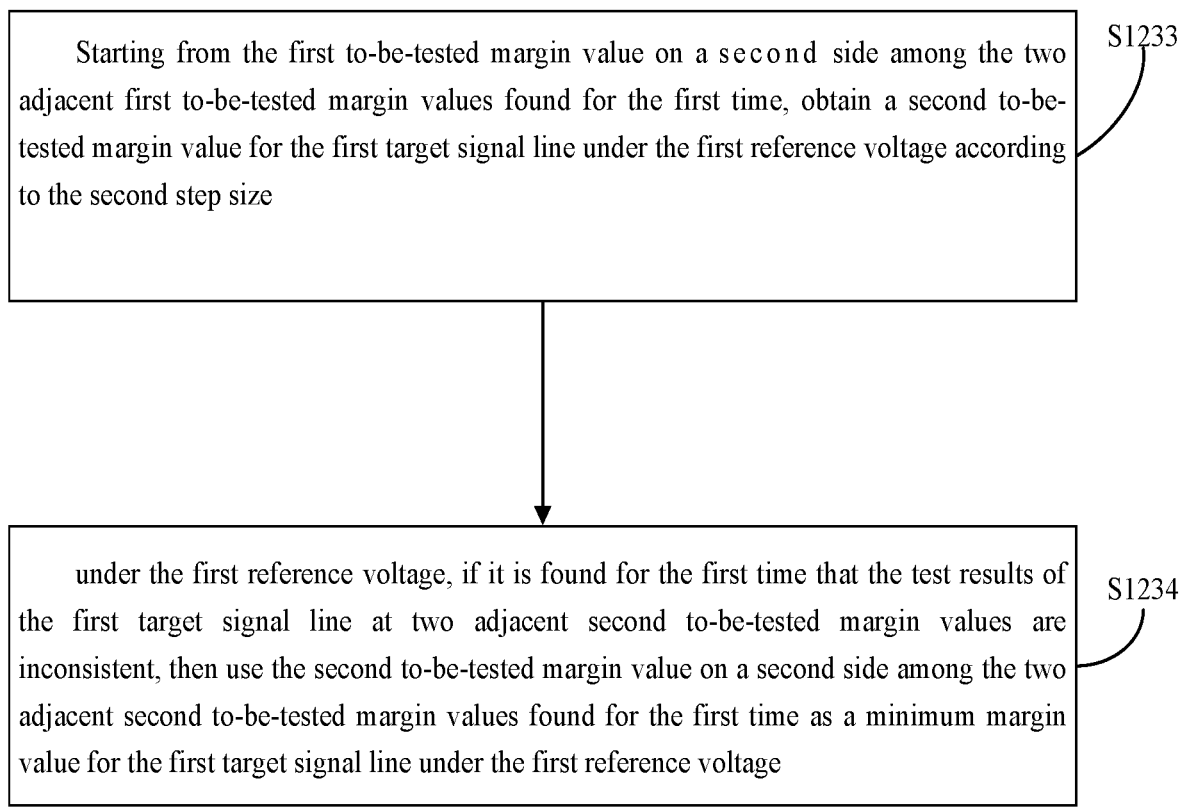
FIG. 5 schematically shows a processing flowchart of the step S123 of FIG. 2 in an exemplary embodiment.

FIG. 5 schematically shows a processing flowchart of the step S123 of FIG. 2 in an exemplary embodiment. As shown in FIG. 5, in an embodiment of the present disclosure, the step S123 may further comprise the following steps.

In the step S1233, starting from the first to-be-tested margin value on a second side among the two adjacent first to-be-tested margin values found for the first time, a second to-be-tested margin value for the first target signal line under the first reference voltage is obtained according to the second step size.

In the step S1234, under the first reference voltage, if it is found for the first time that the test results of the first target signal line at two adjacent second to-be-tested margin values are inconsistent, then the second to-be-tested margin value on a first side among the two adjacent second to-be-tested margin values found for the first time is used as a minimum margin value for the first target signal line under the first reference voltage.

For example, starting from the first to-be-tested margin value of 110 on the right side among the two adjacent first to-be-tested margin values of 100 and 110 found for the first time, the second to-be-tested margin values of 108, 106, 104, 102 for CA0 under the middle reference voltage midVref may be obtained in a decreasing order according to the second step size of 2. Then, first, a determination is made as to whether CA0 can operate normally at the margin value of 108 under the middle reference voltage midVref. Here, it is assumed that the test result shows that CA0 can operate normally. A determination is made as to whether CA0 can operate normally at the margin value of 106 under the middle reference voltage midVref. Here, it is assumed that the test result shows that CA0 still can operate normally. Then, a determination is made as to whether CA0 can operate normally at the margin value of 104 under the middle reference voltage midVref. Here, it is assumed that the test result shows that CA0 still can operate normally. Then, a determination is made as to whether CA0 can operate normally at the margin value of 102 under the middle reference voltage midVref. Here, it is assumed that the test result shows that CA0 cannot operate normally. That is, it is found for the first time that the test results of CA0 at two adjacent second to-be-tested margin values of 104 and 102 are inconsistent. In this case, the second to-be-tested margin value of 104 on the left side may be used as a minimum margin value for CA0 under the middle reference voltage midVref, i.e., the left margin value obtained by the test. It may be known that the results obtained by the test are consistent regardless of increasing from the left side or decreasing from the right side according to the second step size M1 and the accuracy of the results will not be affected.

It should be noted that the embodiment of the present disclosure is not limited to the method of obtaining the left margin value of the operating margin range of each target signal line under each reference voltage by using the two step sizes. For example, three or more step sizes may be set. The three or more step sizes are successively reduced. That is, first, a large interval may be determined for the left margin value according to the largest first step size among the three or more step sizes; then, a small interval may be determined for the left margin value from the large interval according to the second step size that is less than the first step size; and then the left margin value is precisely determined in the small interval according to other step sizes that are less than the second step size.

In an exemplary embodiment, the method may further comprise: under the first reference voltage, if it is found for the second time that the test results of the first target signal line at two adjacent first to-be-tested margin values are inconsistent, then searching for, between the two adjacent first to-be-tested margin values found for the second time and according to a third step size, a maximum margin value for the first target signal line under the first reference voltage; wherein the first step size is greater than the third step size.

In an embodiment of the present disclosure, the third step size M2<the first step size N1, and M2 is a positive integer greater than or equal to 1. The third step size M2 may be equal to or not equal to the second step size M2. In the following examples, M2=M1=2 will be taken as an example for illustration. However, the present disclosure is not limited thereto.

For example, the test is continued from the first to-be-tested margin value of 110. It may be found that CA0 can operate normally at the first to-be-tested margin values of 120, 130, . . . , 700 under the first reference voltage midVref. However, CA0 cannot operate normally at the first to-be-tested margin value of 710. That is, it is found for the second time that the test results of CA0 at two adjacent first to-be-tested margin values of 700 and 701 are inconsistent. It is indicated that the right margin value, i.e., the maximum margin value, of the operating margin range of CA0 under the first reference voltage is between 700 and 710. In this case, the right margin value is searched between 700 and 710 according to a third step size M2.

In an exemplary embodiment, searching for, between the two adjacent first to-be-tested margin values found for the second time and according to a third step size, a maximum margin value for the first target signal line under the first reference voltage may comprise: starting from the first to-be-tested margin value on a first side among the two adjacent first to-be-tested margin values found for the second time, obtaining a third to-be-tested margin value for the first target signal line under the first reference voltage according to the third step size; and under the first reference voltage, if it is found for the first time that the test results of the first target signal line at two adjacent third to-be-tested margin values are inconsistent, then using the third to-be-tested margin value on a first side among the two adjacent third to-be-tested margin values found for the first time as a maximum margin value for the first target signal line under the first reference voltage.

For example, the right margin value is searched between 700 and 710 according to the third step size M2. Starting from 700, the third to-be-tested margin values of 702, 704, 706, 708 may be obtained in an increasing order according to the third step size of M2=2. Then, it is found that CA0 can operate normally at the third to-be-tested margin values of 702, 704, 706 under the first reference voltage. However, it cannot operate normally at the third to-be-tested margin value of 708. That is, it is found for the first time that the test results of CA0 at two adjacent third to-be-tested margin values of 706 and 708 are inconsistent. In this case, the third to-be-tested margin value of 706 on the left side may be used as the maximum margin value under the first reference voltage. Thus, it is known that the operating margin range of CA0 under the first reference voltage is [104,706].

In an exemplary embodiment, searching for, between the two adjacent first to-be-tested margin values found for the second time and according to a third step size, a maximum margin value for the first target signal line under the first reference voltage may comprise: starting from the first to-be-tested margin value on a second side among the two adjacent first to-be-tested margin values found for the second time, obtaining a third to-be-tested margin value for the first target signal line under the first reference voltage according to the third step size; and under the first reference voltage, if it is found for the first time that the test results of the first target signal line at two adjacent third to-be-tested margin values are inconsistent, then using the third to-be-tested margin value on a second side among the two adjacent third to-be-tested margin values found for the first time as a maximum margin value for the first target signal line under the first reference voltage.

For example, the right margin value is searched between 700 and 710 according to the third step size M2. Starting from 710, the third to-be-tested margin values of 708, 706, 704, 702 may be obtained in a decreasing order according to the third step size of M2=2. Then, it is found that CA0 cannot operate normally at the third to-be-tested margin value of 708 under the first reference voltage. However, it can operate normally at the third to-be-tested margin value of 706. That is, it is found for the first time that the test results of CA0 at two adjacent third to-be-tested margin values of 708 and 706 are inconsistent. In this case, the third to-be-tested margin value of 706 on the right side may be used as the maximum margin value under the first reference voltage. Thus, it is known that the operating margin range of CA0 under the first reference voltage is [104,706].

Therefore, to obtain the operating margin range of CA0 under the first reference voltage, 706+2=708 determinations are required in the related technologies (because this process starts from 0 and ends at 707, that is, from 0 to 707); and in contrast, by the method according to the embodiment of the present disclosure, it is just needed to perform 12 tests on the first to-be-tested margin values in the margin range [0-110], 4 tests on the second to-be-tested margin values in the margin range [102-108], 60 tests on the first to-be-tested margin values in the margin range [120-710], and 4 tests on the third to-be-tested margin values in the margin range [702-708], i.e., total 12+4+60+4=80 tests. Compared with the solutions in the related technologies, this method greatly reduces the test times and saves the computation resources. The test speed can be increased, the test time can be saved, and the test efficiency can be improved.

It should be noted that, in the process of obtaining the maximum margin value for the first target signal line under the first reference voltage, it is not necessary to sequentially test all the first to-be-tested margin values and all the second to-be-tested margin values. Similarly, the embodiments of the present disclosure are not limited to the method of obtaining the right margin value of the operating margin range of each target signal line under each reference voltage by using the two step sizes. Furthermore, it is also possible to obtain the first to-be-tested margin values from the right side of the initial margin range, for example 1023, in a decreasing order according to the first step size, which is not limited in the present disclosure.

In other embodiments, the test results of the first target signal line at each first to-be-tested margin value under the first reference voltage may be obtained first. For example, it is assumed that there are 0, N1, 2N1, 3N1, . . . , 100N1 first to-be-tested margin values in the initial margin range. Then, it is found that the first target signal line cannot operate normally at 0-9N1 first to-be-tested margin values, can operate normally at 10N1-80N1 first to-be-tested margin values, and cannot operate normally at 81N1-100N1 first to-be-tested margin values. Thus, it may be determined that the left margin value is between 9N1 and 10N1, and the right margin value is between 80N1 and 81N1. Then, the left margin value is precisely searched between 9N1 and 10N1 according to the first step size M1, and the right margin value is precisely searched between 80N1 and 81N1 according to the second step size M2.

An embodiment of the present disclosure further provides an improvement to the method for obtaining the maximum value (that is, the expected margin value) among the minimum margin values for all target signal lines under all reference voltages. The minimum margin value for each target signal line under each reference voltage may be obtained by the method in the above embodiment. Due to semiconductor memories (for example, the operating nature of semiconductor memories), under each reference voltage, the minimum value among the minimum margin values for all target signal lines is generally in the form of normal distribution, increases with the increase of the reference voltage, or decrease with the increase of the reference voltage. However, it is impossible to know in advance the exact form, because the semiconductor memories may be different. It may be determined by the method according to the embodiment of the present disclosure.

In the following examples, all reference voltages (for example the 81 reference voltages) are sorted in an ascending order.

In an exemplary embodiment, determining a target interval for an expected margin value according to the first minimum margin value and the second minimum margin value may comprise: if the second reference voltage is on the first side of the first reference voltage and the first minimum margin value is greater than the second minimum margin value, determining that the target interval is between the first reference voltage and the maximum reference voltage among the plurality of reference voltages.

For example, taking the second reference voltage as the $(k-1)^{th}$ reference voltage as an example for illustration, if the first minimum margin value $minVal_k$ is greater than the second minimum margin value curVal$_{(k-1)}$, it is indicated that the expected margin value is on the right side of the 81 reference voltages in an ascending order. In this case, it may be determined that the target interval for the expected margin value is between the first reference voltage (the k$^{th}$ reference voltage) and the maximum reference voltage (the 81st reference voltage) among the 81 reference voltages.

Figure 8:
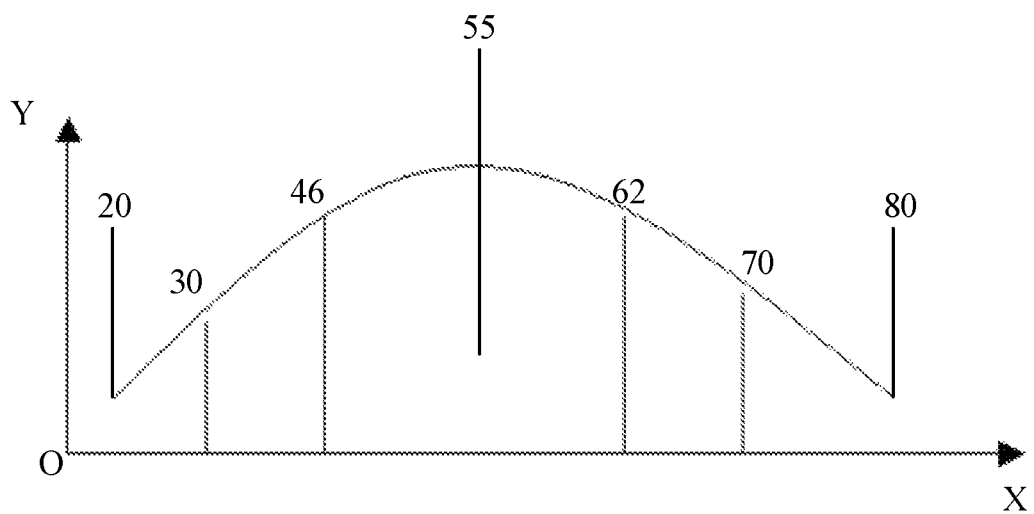
FIG. 8 schematically shows a schematic diagram of normal distribution of reference voltages and margin values according to an embodiment of the present disclosure.

The method will be illustrated below in conjunction with the normal distribution form of FIG. 8. In FIG. 8, the X-axis is the reference voltage, and the Y-axis is the minimum value among the minimum margin values for all target signal lines under each reference voltage.

In FIG. 8, in the reference voltage range of 0-20, the margin value is 0; and under the reference voltage 55, the maximum margin value (i.e., the actual expected margin value) is obtained.

A reference voltage in the reference voltage range is arbitrarily selected as the first reference voltage. Here, it is assumed that the 31st reference voltage (i.e., reference voltage 30) is selected (reference voltage 0 represents the first reference voltage), that is, k=30. The minimum value minVal$_{30}$ (i.e., the first minimum margin value) among the minimum margin values for all target signal lines under the first reference voltage can be obtained.

Then, the minimum value curVal$_{29}$ (i.e., the second minimum margin value) among the minimum margin values for all target signal lines under the reference voltage k−1=29 is obtained. It is found that curVal$_{29}$ is less than minVal$_{30}$, indicating that the expected margin value is on the right side of the reference voltage 30.

Figure 6:
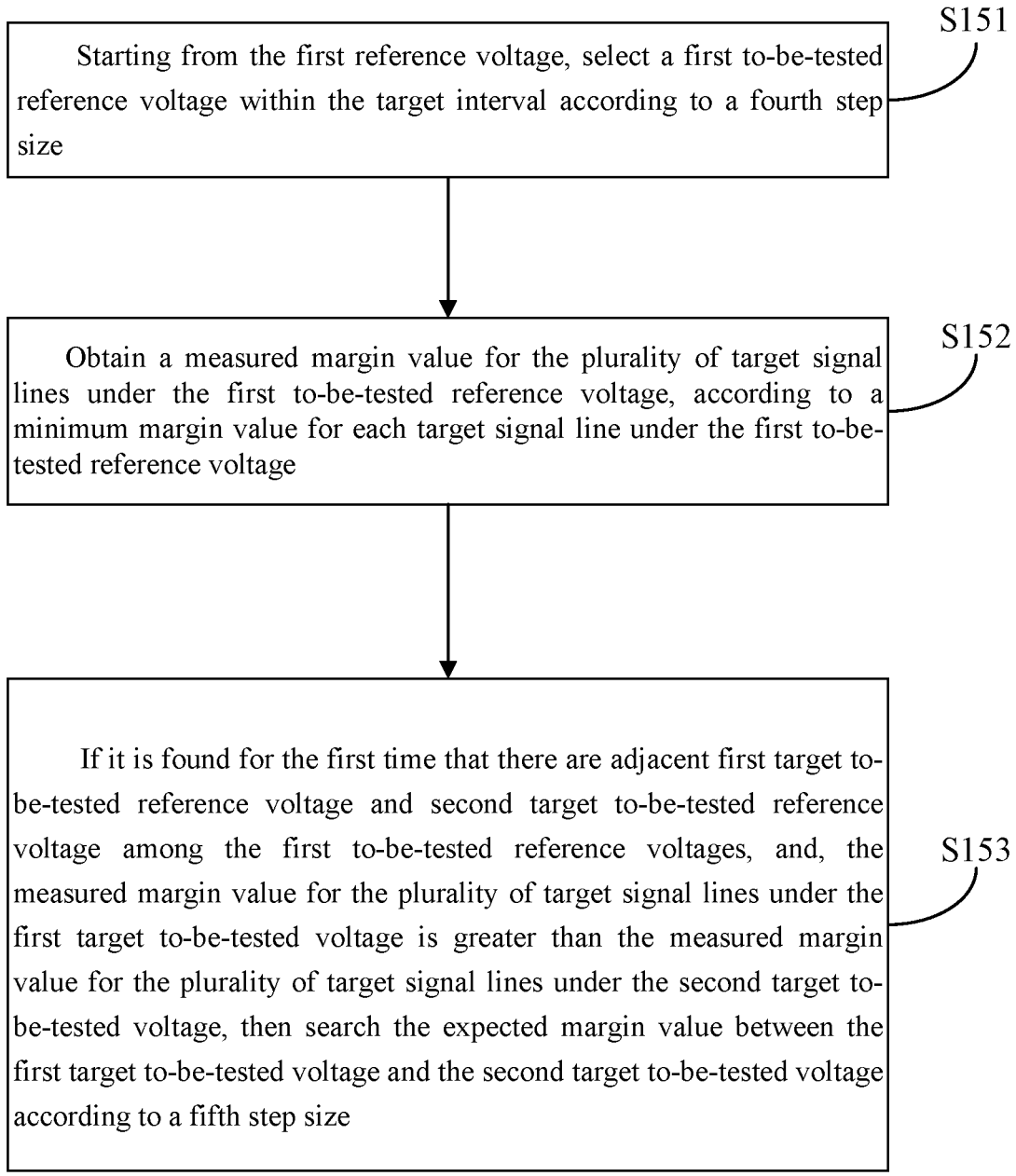
FIG. 6 schematically shows a processing flowchart of the step S150 of FIG. 1 in an exemplary embodiment.

FIG. 6 schematically shows a processing flowchart of the step S150 of FIG. 1 in an exemplary embodiment. As shown in FIG. 6, in an embodiment of the present disclosure, the step S150 may further comprise the following steps.

In the step S151, starting from the first reference voltage, a first to-be-tested reference voltage is selected within the target interval according to a fourth step size.

In an embodiment of the present disclosure, the fourth step size is assumed to be N2, and N2 is a positive integer greater than 1. In the following examples, N2=8 is taken as an example for illustration. However, the present disclosure is not limited thereto. The first to-be-tested reference voltages here still belong to the 81 reference voltages.

Taking FIG. 8 as an example again, starting from the reference voltage 30, the first to-be-tested reference voltages 38, 46, 54, 62, 70, 78, 86 are selected in an increasing order according to the fourth step size N2.

In the step S152, a measured margin value for the plurality of target signal lines under the first to-be-tested reference voltage is obtained, according to a minimum margin value for each target signal line under the first to-be-tested reference voltage.

For example, the minimum margin values for CA0-CA5 under the first to-be-tested reference voltage are obtained, and then the minimum value among the minimum margin values for CA0-CA5 under the first to-be-tested reference voltage is used as the measured margin value for the plurality of target signal lines under the first to-be-tested reference voltage.

Taking FIG. 8 as an example, six minimum margin values for CA0-CA5 under the first to-be-tested reference voltage 38 are obtained, and then the minimum value among the six minimum margin values is used as the measured margin value for CA0-CA5 under the first to-be-tested reference voltage 38. Similarly, the measured margin value for CA0-CA5 under the first to-be-tested reference voltage 46 may be obtained.

In the step S153, if it is found for the first time that there are adjacent first target to-be-tested reference voltage and second target to-be-tested reference voltage among the first to-be-tested reference voltages, and, the measured margin value for the plurality of target signal lines under the first target to-be-tested voltage is greater than the measured margin value for the plurality of target signal lines under the second target to-be-tested voltage, then the expected margin value is searched between the first target to-be-tested voltage and the second target to-be-tested voltage according to a fifth step size.

In an embodiment of the present disclosure, the fifth step size is assumed to be M3, M3 is a positive integer greater than or equal to 1, and M3<N2. In the following examples, it is assumed that M3=2.

Taking FIG. 8 as an example, the measured margin value for CA0-CA5 under the first to-be-tested reference voltage 38 is less than the measured margin value for CA0-CA5 under the first to-be-tested reference voltage 46, indicating that the expected margin value is on the right side of the first to-be-tested reference voltage 46. It is needed to search the expected margin value continuously. Then, the measured margin value for CA0-CA5 under the first to-be-tested reference voltage 54 is obtained. By comparison, it is found that the measured margin value for CA0-CA5 under the first to-be-tested reference voltage 46 is less than the measured margin value for CA0-CA5 under the first to-be-tested reference voltage 54, indicating that the expected margin value is on the right side of the first to-be-tested reference voltage 54. It is needed to search the expected margin value continuously. Then, the measured margin value for CA0-CA5 under the first to-be-tested reference voltage 62 is obtained. By comparison, it is found that the measured margin value for CA0-CA5 under the first to-be-tested reference voltage 54 is greater than the measured margin value for CA0-CA5 under the first to-be-tested reference voltage 62, indicating that the expected margin value is between the two adjacent first to-be-tested reference voltages 54 and 62. In this case, the first to-be-tested reference voltage 54 is the first target to-be-tested voltage and the first to-be-tested reference voltage 62 is the second target to-be-tested voltage.

Then, the expected margin value is searched between the first target to-be-tested voltage 54 and the second target to-be-tested voltage 62 according to the fifth step size M3.

Figure 7:
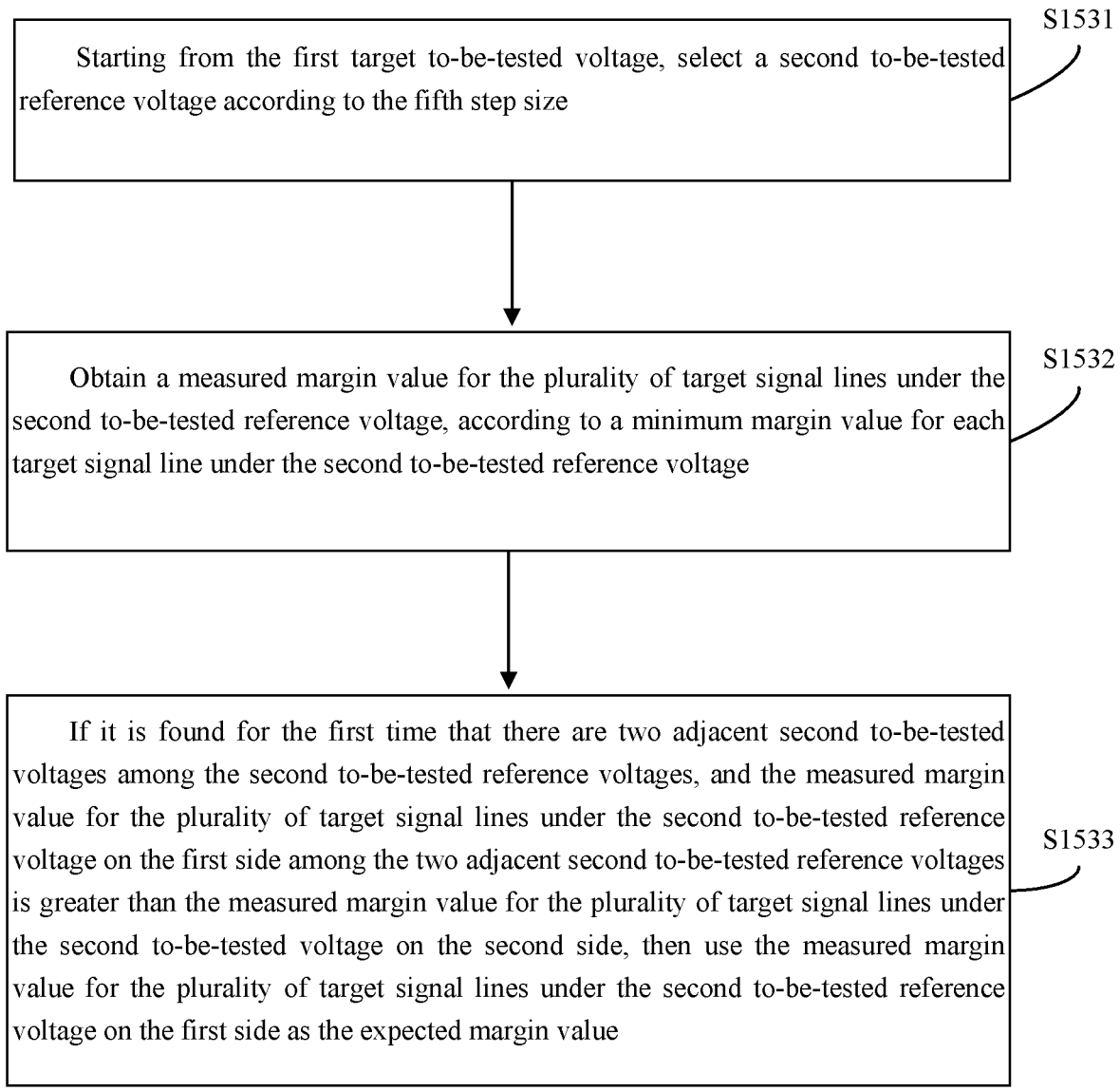
FIG. 7 schematically shows a processing flowchart of the step S153 of FIG. 6 in an exemplary embodiment.

FIG. 7 schematically shows a processing flowchart of the step S153 of FIG. 6 in an exemplary embodiment. As shown in FIG. 7, in an embodiment of the present disclosure, the step S153 may further comprise the following steps.

In the step S1531, starting from the first target to-be-tested voltage, a second to-be-tested reference voltage is selected according to the fifth step size.

For example, starting from the first target to-be-tested voltage 54, the second to-be-tested reference voltages 54, 56, 58, 60, 62 may be obtained by in an increasing order according to the fifth step size M3=2.

In the step S1532, a measured margin value for the plurality of target signal lines under the second to-be-tested reference voltage is obtained, according to a minimum margin value for each target signal line under the second to-be-tested reference voltage.

For example, six minimum margin values for CA0-CA5 under the second to-be-tested reference voltage 56 are obtained, and then the minimum value among the six minimum margin values is used as the measured margin value for CA0-CA5 under the second to-be-tested reference voltage 56.

In the step S1533, if it is found for the first time that there are two adjacent second to-be-tested voltages among the second to-be-tested reference voltages, and the measured margin value for the plurality of target signal lines under the second to-be-tested reference voltage on the first side among the two adjacent second to-be-tested reference voltages is greater than the measured margin value for the plurality of target signal lines under the second to-be-tested voltage on the second side, then, the measured margin value for the plurality of target signal lines under the second to-be-tested reference voltage on the first side is used as the expected margin value.

For example, if the measured margin value for CA0-CA5 under the second to-be-tested reference voltage 54 is less than the measured margin value for CA0-CA5 under the second to-be-tested reference voltage 56, it is indicated that the expected margin value is on the right side of the second to-be-tested reference voltage 56. Then, the measured margin value for CA0-CA5 under the second to-be-tested reference voltage 58 is obtained. By comparison, it is found that the measured margin value for CA0-CA5 under the second to-be-tested reference voltage 56 is greater than the measured margin value for CA0-CA5 under the second to-be-tested reference voltage 58. In this case, the measured margin value for CA0-CA5 under the second to-be-tested reference voltage 56 is used as the expected margin value.

It is understandable that there may be an error between the expected margin value searched according to the fourth step size and the fifth step size and the actual expected margin value. However, this expected margin value is an expected margin value close to the actual expected margin value, obtained by a tradeoff between the test time and the test effect.

In an exemplary embodiment, searching for the expected margin value between the first target to-be-tested voltage and the second target to-be-tested voltage according to the fifth step size may further comprise: if the measured margin value for the plurality of target signal lines under the second to-be-tested reference voltage on the first side among the two adjacent second to-be-tested reference voltages is equal to the measured margin value for the plurality of target signal lines under the second to-be-tested voltage on the second side, then, using the measured margin value for the plurality of target signal lines under the second to-be-tested reference voltage on the second side as the expected margin value; or using the measured margin value for the plurality of target signal lines under an average reference voltage of the two adjacent second to-be-tested reference voltages as the expected margin value.

Taking FIG. 8 as an example, if the measured margin value for CA0-CA5 under the second to-be-tested reference voltage 56 is equal to the measured margin value for CA0-CA5 under the second to-be-tested reference voltage 54, the measured margin value for CA0-CA5 under the second to-be-tested reference voltage 56 may be used as the expected margin value. Or, the average reference voltage 55 of the second to-be-tested reference voltages 54 and 56 may be obtained, and the measured margin value for CA0-CA5 under the average reference voltage 55 may be used as the expected margin value.

In an exemplary embodiment, searching for the expected margin value in the target interval may further comprise: if the measured margin value for the plurality of target signal lines under the maximum reference voltage is the maximum value among the measured margin values for the plurality of target signal lines under all first to-be-tested voltages, then using the measured margin value for the plurality of target signal lines under the maximum reference voltage as the expected margin value.

For example, in a case where the minimum value among the minimum margin values increases with the increase of the reference voltage, the measured margin value corresponding to the maximum reference voltage among the 81 reference voltages may be searched according to the fourth step size and the fifth step size, which is the expected margin value.

In an exemplary embodiment, determining a target interval for an expected margin value according to the first minimum margin value and the second minimum margin value may comprise: if the second reference voltage is on the first side of the first reference voltage and the first minimum margin value is less than the second minimum margin value, determining that the target interval is between the second reference voltage and the minimum reference voltage among the plurality of reference voltages.

For example, here, the description will be given in the assumption that the first reference voltage is k=62 (reference voltage 62) and the second reference voltage is k−1=61 (reference voltage 61). It may be known from FIG. 8 that the first minimum margin value $minVal_k$ is less than the second minimum margin value $curVal_{(k-1)}$. It is indicated that the expected margin value is on the left side of the 81 reference voltages in an ascending order. In this case, it may be determined that the target interval for the expected margin value is between the second reference voltage (the reference voltage 61) and the minimum reference voltage (the reference voltage 0) among the 81 reference voltages.

Figure 9:
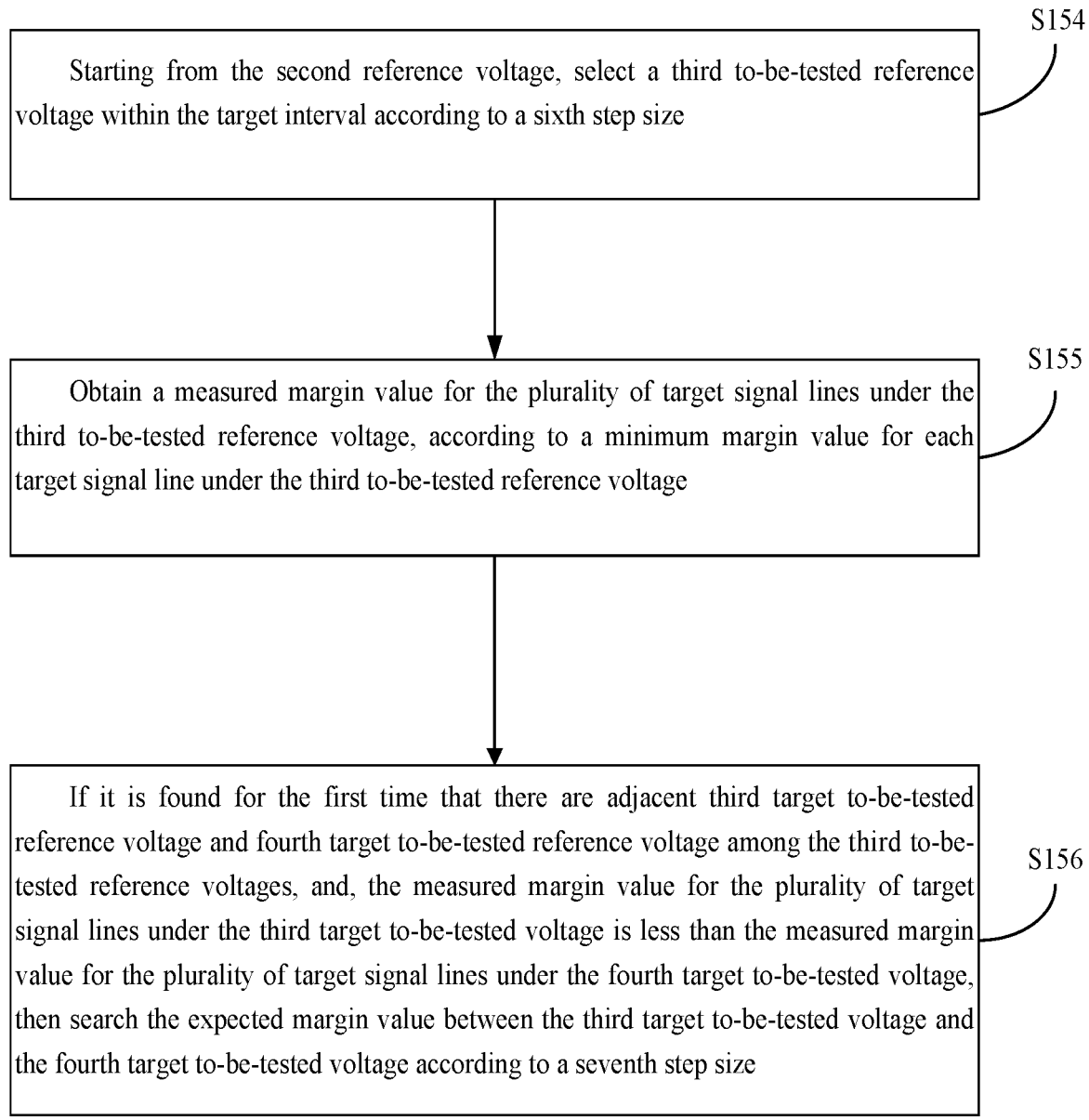
FIG. 9 schematically shows a processing flowchart of the step S150 of FIG. 1 in an exemplary embodiment.

FIG. 9 schematically shows a processing flowchart of the step S150 of FIG. 1 in an exemplary embodiment. As shown in FIG. 9, in an embodiment of the present disclosure, the step S150 may further comprise the following steps.

In the step S154, starting from the second reference voltage, a third to-be-tested reference voltage is selected within the target interval according to a sixth step size.

In an embodiment of the present disclosure, the sixth step size is assumed to be N3, and N3 is a positive integer greater than 1. The sixth step size may be equal to or different from the fourth step size. In the following examples, it is assumed that M3=8.

For example, starting from the reference voltage 61, the third to-be-tested reference voltages 61 and 53 may be obtained in a decreasing order according to the sixth step size.

In the step S155, a measured margin value for the plurality of target signal lines under the third to-be-tested reference voltage is obtained, according to a minimum margin value for each target signal line under the third to-be-tested reference voltage.

For example, six minimum margin values for CA0-CA5 under the third to-be-tested reference voltage 61 are obtained, and then the minimum value among the six minimum margin values is used as the measured margin value for CA0-CA5 under the third to-be-tested reference voltage 61. Similarly, the measured margin value for CA0-CA5 under the third to-be-tested reference voltage 53 may be obtained.

In the step S156, if it is found for the first time that there are adjacent third target to-be-tested reference voltage and fourth target to-be-tested reference voltage among the third to-be-tested reference voltages, and, the measured margin value for the plurality of target signal lines under the third target to-be-tested voltage is less than the measured margin value for the plurality of target signal lines under the fourth target to-be-tested voltage, then the expected margin value is searched between the third target to-be-tested voltage and the fourth target to-be-tested voltage according to a seventh step size.

In an embodiment of the present disclosure, the seventh step size is assumed to be M4, M4 is a positive integer greater than or equal to 1, and M4<N3. In the following examples, it is assumed that M4=2.

For example, in FIG. 8, if the measured margin value for CA0-CA5 under the third to-be-tested reference voltage 61 is less than the measured margin value for CA0-CA5 under the third to-be-tested reference voltage 53, the third target to-be-tested reference voltage is the third to-be-tested reference voltage 61, and the fourth target to-be-tested voltage is the third to-be-tested reference voltage 53. It is indicated that the expected margin value is between the third target to-be-tested reference voltage 61 and the fourth target to-be-tested voltage 53. The expected margin value is precisely searched between the third target to-be-tested reference voltage 61 and the fourth target to-be-tested voltage 53 according to the seventh step size.

Figure 10:
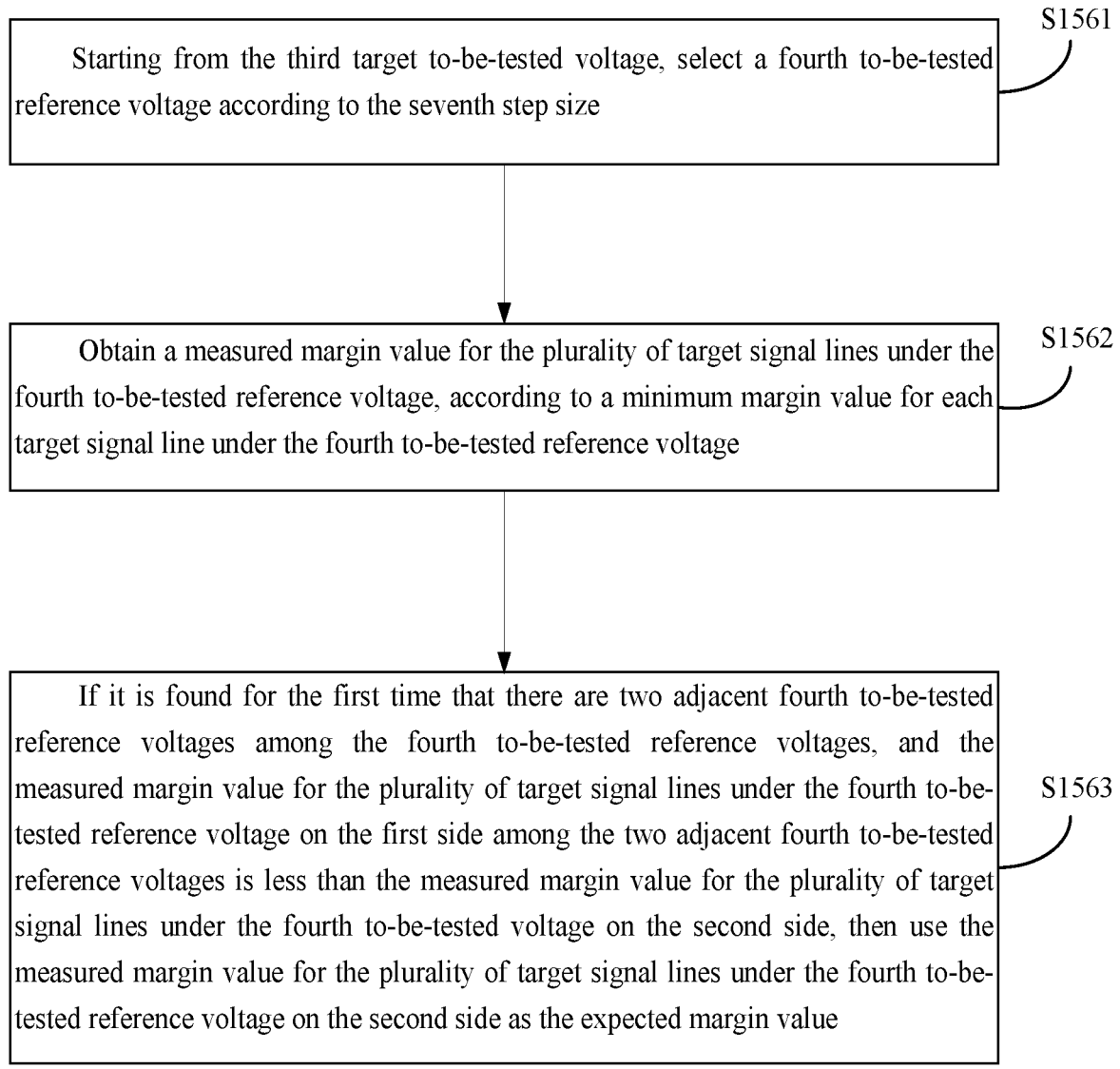
FIG. 10 schematically shows a processing flowchart of the step S156 of FIG. 9 in an exemplary embodiment.

FIG. 10 schematically shows a processing flowchart of the step S156 of FIG. 9 in an exemplary embodiment. As shown in FIG. 10, in an embodiment of the present disclosure, the step S156 may further comprise the following steps.

In the step S1561, starting from the third target to-be-tested voltage, a fourth to-be-tested reference voltage is selected according to the seventh step size.

For example, starting from the third target to-be-tested reference voltage 61, the fourth to-be-tested reference voltages 61, 59, 57, 55, 53 are obtained in a decreasing order according to the seventh step size.

In the step S1562, a measured margin value for the plurality of target signal lines under the fourth to-be-tested reference voltage is obtained, according to a minimum margin value for each target signal line under the fourth to-be-tested reference voltage.

For example, six minimum margin values for CA0-CA5 under the fourth to-be-tested reference voltage 59 are obtained, and then the minimum value among the six minimum margin values is used as the measured margin value for CA0-CA5 under the fourth to-be-tested reference voltage 59.

In the step S1563, if it is found for the first time that there are two adjacent fourth to-be-tested reference voltages among the fourth to-be-tested reference voltages, and the measured margin value for the plurality of target signal lines under the fourth to-be-tested reference voltage on the first side among the two adjacent fourth to-be-tested reference voltages is less than the measured margin value for the plurality of target signal lines under the fourth to-be-tested voltage on the second side, then, the measured margin value for the plurality of target signal lines under the fourth to-be-tested reference voltage on the second side is used as the expected margin value.

For example, if the measured margin value for CA0-CA5 under the fourth to-be-tested reference voltage 59 is greater than the measured margin value for CA0-CA5 under the fourth to-be-tested reference voltage 61, it is indicated that the expected margin value is on the left side of the fourth to-be-tested reference voltage 59. It is needed to search the expected margin value continuously. Then, the measured margin value for CA0-CA5 under the fourth to-be-tested reference voltage 57 is obtained. By comparison, it is found that the measured margin value for CA0-CA5 under the fourth to-be-tested reference voltage 57 is less than the measured margin value for CA0-CA5 under the fourth to-be-tested reference voltage 59, indicating that the expected margin value is on the left side of the fourth to-be-tested reference voltage 57. It is needed to search the expected margin value continuously. Then, the measured margin value for CA0-CA5 under the fourth to-be-tested reference voltage 55 is obtained. By comparison, it is found that the measured margin value for CA0-CA5 under the fourth to-be-tested reference voltage 55 is greater than the measured margin value for CA0-CA5 under the fourth to-be-tested reference voltage 57, indicating that the expected margin value is on the left side of the fourth to-be-tested reference voltage 55. It is needed to search the expected margin value continuously. Then, the measured margin value for CA0-CA5 under the fourth to-be-tested reference voltage 53 is obtained. By comparison, it is found that the measured margin value for CA0-CA5 under the fourth to-be-tested reference voltage 53 is less than the measured margin value for CA0-CA5 under the fourth to-be-tested reference voltage 55. In this case, the measured margin value for CA0-CA5 under the fourth to-be-tested reference voltage 55 may be used as the expected margin value.

In an exemplary embodiment, searching for the expected margin value in the target interval may further comprise: if the measured margin value for the plurality of target signal lines under the last third to-be-tested reference voltage is the maximum value among the measured margin values for the plurality of target signal lines under all third to-be-tested reference voltages, then using the measured margin value for the plurality of target signal lines under the minimum reference voltage as the expected margin value.

For example, in a case where the minimum value among the minimum margin values decreases with the increase of the reference voltage, the measured margin value corresponding to the minimum reference voltage among the 81 reference voltages may be searched according to the sixth step size and the seventh step size, which is the expected margin value.

By the method in the embodiments of the present disclosure, first, a determination is made as to whether the reference voltage corresponding to the expected margin value is on the left side or the right side; then, the search range is reduced by using a large step size (for example, the fourth step size or the sixth step size); and then, the margin value is precisely searched by using a small step size (for example, the fifth step size or the seventh step size). In this way, the retrieval of the expected margin value can be accelerated, the training time can be reduced, the training effect can be improved, and the accuracy of the training results can be ensured.

The following describes the embodiments of the apparatus of the present disclosure, which may be used to execute the above-mentioned data resource processing method of the present disclosure. For details not disclosed in the embodiments of the apparatus of the present disclosure, please refer to the embodiment of the data resource processing method of the present disclosure.

Figure 11:
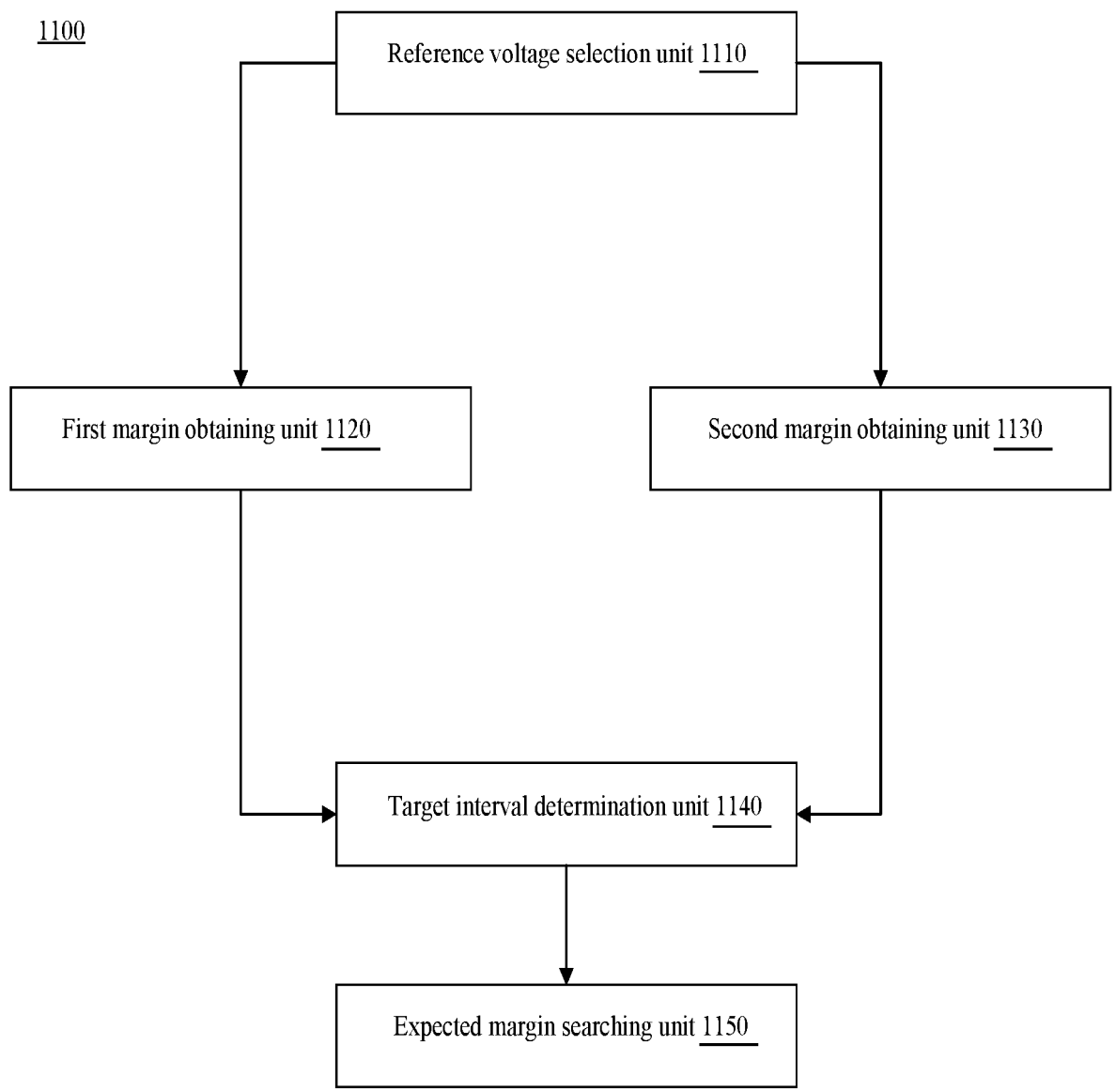
FIG. 11 schematically shows a block diagram of a semiconductor memory training apparatus according to an embodiment of the present disclosure.

FIG. 11 schematically shows a block diagram of a semiconductor memory training apparatus according to an embodiment of the present disclosure. In an embodiment of the present disclosure, the semiconductor memory may comprise a plurality of target signal lines, and each target signal line has a plurality of reference voltages within a target voltage reference range.

Referring to FIG. 11, a semiconductor memory training apparatus 1100 according to an embodiment of the present disclosure may comprise: a reference voltage selection unit 1110, a first margin obtaining unit 1120, a second margin obtaining unit 1130, and a target interval determination unit 1140 and an expected margin searching unit 1150.

The reference voltage selection unit 1110 may be configured to select two adjacent reference voltages from the plurality of reference voltages as a first reference voltage and a second reference voltage. The first margin obtaining unit 1120 may be configured to obtain a first minimum margin value for the plurality of target signal lines under the first reference voltage according to a minimum margin value for each target signal line under the first reference voltage. The second margin obtaining unit 1130 may be configured to obtain a second minimum margin value for the plurality of target signal lines under the second reference voltage according to a minimum margin value for each target signal line under the second reference voltage. The target interval determination unit 1140 may be configured to determine a target interval for an expected margin value according to the first minimum margin value and the second minimum margin value, the expected margin value being the maximum value among the minimum margin values for the plurality of target signal lines under the plurality of reference voltages. The expected margin searching unit 1150 may be configured to search for the expected margin value in the target interval to determine a reference voltage corresponding to the expected margin value as the training result of the semiconductor memory.

In an exemplary embodiment, the plurality of target signal lines comprise a first target signal line. The first margin obtaining unit 1120 may comprise: an initial margin range obtaining unit which may be configured to obtain an initial margin range for the first target signal line under the first reference voltage; a first to-be-tested margin obtaining unit which may be configured to obtain, within the initial margin range and according to a first step size, a first to-be-tested margin value for the first target signal line under the first reference voltage; a unit for searching according to a second step size, which may be configured to: under the first reference voltage, if it is found for the first time that the test results of the first target signal line at two adjacent first to-be-tested margin values are inconsistent, then search for, between the two adjacent first to-be-tested margin values found for the first time and according to a second step size, a minimum margin value for the first target signal line under the first reference voltage. The first step size is greater than the second step size.

In an exemplary embodiment, the first margin obtaining unit 1120 may further comprise: a data write unit which may be configured to write data to the semiconductor memory under the first reference voltage; a data read unit which may be configured to read data from the semiconductor memory under the first reference voltage after the first to-be-tested margin value; a normal operation determination unit which may be configured to determine, if the written data is consistent with the read data, that the test result of the first target signal line is indicative of normal operation at the first to-be-tested margin value under the first reference voltage; and an abnormal operation determination unit which may be configured to determine, if the written data is not consistent with the read data, that the test result of the first target signal line is indicative of abnormal operation at the first to-be-tested margin value under the first reference voltage.

In an exemplary embodiment, the unit for searching according to the second step size may comprise: a first-side second to-be-tested margin value obtaining unit which may be configured to: starting from the first to-be-tested margin value on a first side among the two adjacent first to-be-tested margin values found for the first time, obtain a second to-be-tested margin value for the first target signal line under the first reference voltage according to the second step size; a first minimum margin value determination unit which may be configured to: under the first reference voltage, if it is found for the first time that the test results of the first target signal line at two adjacent second to-be-tested margin values are inconsistent, then use the second to-be-tested margin value on a second side among the two adjacent second to-be-tested margin values found for the first time as a minimum margin value for the first target signal line under the first reference voltage.

In an exemplary embodiment, the unit for searching according to the second step size may comprise: a second-side second to-be-tested margin value obtaining unit which may be configured to: starting from the first to-be-tested margin value on a second side among the two adjacent first to-be-tested margin values found for the first time, obtain a second to-be-tested margin value for the first target signal line under the first reference voltage according to the second step size; a second minimum margin value determination unit which may be configured to: under the first reference voltage, if it is found for the first time that the test results of the first target signal line at two adjacent second to-be-tested margin values are inconsistent, then use the second to-be-tested margin value on a first side among the two adjacent second to-be-tested margin values found for the first time as a minimum margin value for the first target signal line under the first reference voltage.

In an exemplary embodiment, the semiconductor memory training apparatus 1100 may further comprise: a unit for searching according to a third step size, which may be configured to: under the first reference voltage, if it is found for the second time that the test results of the first target signal line at two adjacent first to-be-tested margin values are inconsistent, then search for, between the two adjacent first to-be-tested margin values found for the second time and according to a third step size, a maximum margin value for the first target signal line under the first reference voltage. The first step size is greater than the third step size.

In an exemplary embodiment, the unit for searching according to the third step size may comprise: a first-side third to-be-tested margin value obtaining unit which may be configured to: starting from the first to-be-tested margin value on a first side among the two adjacent first to-be-tested margin values found for the first time, obtain a third to-be-tested margin value for the first target signal line under the first reference voltage according to the third step size; a first maximum margin value determination unit which may be configured to: under the first reference voltage, if it is found for the first time that the test results of the first target signal line at two adjacent third to-be-tested margin values are inconsistent, then use the third to-be-tested margin value on a first side among the two adjacent third to-be-tested margin values found for the first time as a maximum margin value for the first target signal line under the first reference voltage.

In an exemplary embodiment, the unit for searching according to the third step size may comprise: a second-side third to-be-tested margin value obtaining unit which may be configured to: starting from the first to-be-tested margin value on a second side among the two adjacent first to-be-tested margin values found for the first time, obtain a third to-be-tested margin value for the first target signal line under the first reference voltage according to the third step size; a second maximum margin value determination unit which may be configured to: under the first reference voltage, if it is found for the first time that the test results of the first target signal line at two adjacent third to-be-tested margin values are inconsistent, then use the third to-be-tested margin value on a second side among the two adjacent third to-be-tested margin values found for the first time as a maximum margin value for the first target signal line under the first reference voltage.

In an exemplary embodiment, the target interval determination unit 1140 may comprise a first target interval determination unit which may be configured to: if the second reference voltage is on the first side of the first reference voltage and the first minimum margin value is greater than the second minimum margin value, determine that the target interval is between the first reference voltage and the maximum reference voltage among the plurality of reference voltages.

In an exemplary embodiment, the expected margin searching unit 1150 may comprise: a first to-be-tested reference voltage selection unit which may be configured to: starting from the first reference voltage, select a first to-be-tested reference voltage within the target interval according to a fourth step size; a first measured margin value obtaining unit which may be configured to obtain a measured margin value for the plurality of target signal lines under the first to-be-tested reference voltage, according to a minimum margin value for each target signal line under the first to-be-tested reference voltage; a unit for searching according to a fifth step size, which may be configured to: if it is found for the first time that there are adjacent first target to-be-tested reference voltage and second target to-be-tested reference voltage among the first to-be-tested reference voltages, and, the measured margin value for the plurality of target signal lines under the first target to-be-tested voltage is greater than the measured margin value for the plurality of target signal lines under the second target to-be-tested voltage, then search for the expected margin value between the first target to-be-tested voltage and the second target to-be-tested voltage according to a fifth step size. The fifth step size is less than the fourth step size.

In an exemplary embodiment, the unit for searching according to a fifth step size may comprise: a second to-be-tested reference voltage selection unit which may be configured to: starting from the first target to-be-tested voltage, select a second to-be-tested reference voltage according to the fifth step size; a second measured margin value obtaining unit which may be configured to obtain a measured margin value for the plurality of target signal lines under the second to-be-tested reference voltage, according to a minimum margin value for each target signal line under the second to-be-tested reference voltage; and a first expected margin value determination unit which may be configured to: if it is found for the first time that there are two adjacent second to-be-tested voltages among the second to-be-tested reference voltages, and the measured margin value for the plurality of target signal lines under the second to-be-tested reference voltage on the first side among the two adjacent second to-be-tested reference voltages is greater than the measured margin value for the plurality of target signal lines under the second to-be-tested voltage on the second side, then, use the measured margin value for the plurality of target signal lines under the second to-be-tested reference voltage on the first side as the expected margin value.

In an exemplary embodiment, the unit for searching according to a fifth step size may further comprise: a second expected margin value determination unit which may be configured to: if the measured margin value for the plurality of target signal lines under the second to-be-tested reference voltage on the first side among the two adjacent second to-be-tested reference voltages is equal to the measured margin value for the plurality of target signal lines under the second to-be-tested voltage on the second side, then, use the measured margin value for the plurality of target signal lines under the second to-be-tested reference voltage on the second side as the expected margin value; or use the measured margin value for the plurality of target signal lines under an average reference voltage of the two adjacent second to-be-tested reference voltages as the expected margin value.

In an exemplary embodiment, the expected margin searching unit 1150 may further comprise: a third expected margin value determination unit which may be configured to: if the measured margin value for the plurality of target signal lines under the maximum reference voltage is the maximum value among the measured margin values for the plurality of target signal lines under all first to-be-tested reference voltages, then use the measured margin value for the plurality of target signal lines under the maximum reference voltage as the expected margin value.

In an exemplary embodiment, the target interval determination unit 1140 may comprise a second target interval determination unit which may be configured to: if the second reference voltage is on the first side of the first reference voltage and the first minimum margin value is less than the second minimum margin value, determine that the target interval is between the second reference voltage and the minimum reference voltage among the plurality of reference voltages.

In an exemplary embodiment, the expected margin searching unit 1150 may comprise: a third to-be-tested reference voltage selection unit which may be configured to: starting from the second reference voltage, obtain a third to-be-tested reference voltage within the target interval according to a sixth step size; a third measured margin value obtaining unit which may be configured to obtain a measured margin value for the plurality of target signal lines under the third to-be-tested reference voltage, according to a minimum margin value for each target signal line under the third to-be-tested reference voltage; a unit for searching according to a seventh step size, which may be configured to: if it is found for the first time that there are adjacent third target to-be-tested reference voltage and fourth target to-be-tested reference voltage among the third to-be-tested reference voltages, and, the measured margin value for the plurality of target signal lines under the third target to-be-tested voltage is less than the measured margin value for the plurality of target signal lines under the fourth target to-be-tested voltage, then search for the expected margin value between the third target to-be-tested voltage and the fourth target to-be-tested voltage according to a seventh step size. The seventh step size is less than the sixth step size.

In an exemplary embodiment, the unit for searching according to a seventh step size may comprise: a fourth to-be-tested reference voltage selection unit which may be configured to: starting from the third target to-be-tested voltage, select a fourth to-be-tested reference voltage according to the seventh step size; a fourth measured margin value obtaining unit which may be configured to obtain a measured margin value for the plurality of target signal lines under the fourth to-be-tested reference voltage, according to a minimum margin value for each target signal line under the fourth to-be-tested reference voltage; and a fourth expected margin value determination unit which may be configured to: if it is found for the first time that there are two adjacent fourth to-be-tested reference voltages among the fourth to-be-tested reference voltages, and the measured margin value for the plurality of target signal lines under the fourth to-be-tested reference voltage on the first side among the two adjacent fourth to-be-tested reference voltages is less than the measured margin value for the plurality of target signal lines under the fourth to-be-tested voltage on the second side, then, use the measured margin value for the plurality of target signal lines under the fourth to-be-tested reference voltage on the second side as the expected margin value.

In an exemplary embodiment, the expected margin searching unit 1150 may further comprise: a fifth expected margin value determination unit which may be configured to: if the measured margin value for the plurality of target signal lines under the last third to-be-tested reference voltage is the maximum value among the measured margin values for the plurality of target signal lines under all third to-be-tested reference voltages, then use the measured margin value for the plurality of target signal lines under the minimum reference voltage as the expected margin value.

It should be noted that, although several units of the device for action execution are mentioned in the above detailed description, this division is not mandatory. In fact, according to the implementations of the present disclosure, the features and functions of two or more units described above may be embodied in one unit. Conversely, the features and functions of a unit described above may be further divided into multiple units.

Through the above description of the implementations, those skilled in the art can easily understand that the exemplary implementations described here may be implemented by software, or may be implemented by the combination of software with necessary hardware. Therefore, the technical solutions according to the implementations of the present disclosure may be embodied in the form of software products which may be stored in a non-volatile storage medium (which may be a CD-ROM, a U disk, a mobile hard disk, etc.) or on the network, including several instructions to enable a computing device (which may be a personal computer, a server, a touch terminal, or a network device, etc.) to execute the method according to the implementations of the present disclosure.

Further, an implementation of the present disclosure further provides an electronic device. The electronic device comprises: one or more processors; and a storage apparatus, configured to store one or more programs; and the one or more programs cause, when executed by the one or more processors, the one or more processors to implement the method described in any of the above embodiments.

Further, an implementation of the present disclosure further provides a computer-readable medium having computer programs stored thereon that, when executed by a processor, cause the processor to implement the method described in any of the above embodiments.

Those skilled in the art will readily think of other embodiments of the present disclosure by considering the specification and practicing the invention disclosed herein. The present application is intended to encompass any variations, uses, or adaptive changes of the present disclosure. These variations, uses, or adaptive changes follow the general principles of the present disclosure and include common knowledge or conventional technical means in the technical field that are not disclosed in the present disclosure. The specification and the embodiments are just exemplary, and the true scope and spirit of the present disclosure are defined by the appended claims.

What is claimed is:

1. A semiconductor memory training method for a semiconductor memory comprising a plurality of target signal lines, each target signal line having a plurality of reference voltages within a target voltage reference range; wherein the method comprises:
    selecting two adjacent reference voltages from the plurality of reference voltages as a first reference voltage and a second reference voltage;
    obtaining a first minimum margin value for the plurality of target signal lines under the first reference voltage, according to a minimum margin value for each target signal line under the first reference voltage;
    obtaining a second minimum margin value for the plurality of target signal lines under the second reference voltage, according to a minimum margin value for each target signal line under the second reference voltage;
    determining a target interval for an expected margin value according to the first minimum margin value and the second minimum margin value, the expected margin value being a maximum value among the minimum margin values for the plurality of target signal lines under the plurality of reference voltages; and
    searching for the expected margin value in the target interval, to determine a reference voltage corresponding to the expected margin value as a training result of the semiconductor memory.

2. The semiconductor memory training method according to claim 1, wherein the plurality of target signal lines comprise a first target signal line; wherein obtaining a first minimum margin value for the plurality of target signal lines under the first reference voltage comprises:
    obtaining an initial margin range for the first target signal line under the first reference voltage;
    obtaining, within the initial margin range and according to a first step size, a first to-be-tested margin value for the first target signal line under the first reference voltage;
    under the first reference voltage, if it is found for the first time that the test results of the first target signal line at two adjacent first to-be-tested margin values are inconsistent, then searching for, between the two adjacent first to-be-tested margin values found for the first time and according to a second step size, the minimum margin value for the first target signal line under the first reference voltage; and
    wherein the first step size is greater than the second step size.

3. The semiconductor memory training method according to claim 2, wherein said obtaining a first minimum margin value for the plurality of target signal lines under the first reference voltage further comprises:
    writing data to the semiconductor memory under the first reference voltage;
    reading data from the semiconductor memory under the first reference voltage and after the first to-be-tested margin value;
    if the written data is consistent with the read data, determining that the test result of the first target signal line is indicative of normal operation at the first to-be-tested margin value under the first reference voltage; and
    if the written data is not consistent with the read data, determining that the test result of the first target signal line is indicative of abnormal operation at the first to-be-tested margin value under the first reference voltage.

4. The semiconductor memory training method according to claim 2, wherein said searching for, between the two adjacent first to-be-tested margin values found for the first time and according to a second step size, the minimum margin value for the first target signal line under the first reference voltage comprises:
   starting from the first to-be-tested margin value on a first side among the two adjacent first to-be-tested margin values found for the first time, obtaining a second to-be-tested margin value for the first target signal line under the first reference voltage according to the second step size; and
   under the first reference voltage, if it is found for the first time that the test results of the first target signal line at two adjacent second to-be-tested margin values are inconsistent, then using the second to-be-tested margin value on a second side among the two adjacent second to-be-tested margin values found for the first time as the minimum margin value for the first target signal line under the first reference voltage.

5. The semiconductor memory training method according to claim 2, wherein said searching for, between the two adjacent first to-be-tested margin values found for the first time and according to a second step size, the minimum margin value for the first target signal line under the first reference voltage comprises:
   starting from the first to-be-tested margin value on a second side among the two adjacent first to-be-tested margin values found for the first time, obtaining a second to-be-tested margin value for the first target signal line under the first reference voltage according to the second step size; and
   under the first reference voltage, if it is found for the first time that the test results of the first target signal line at two adjacent second to-be-tested margin values are inconsistent, then using the second to-be-tested margin value on a first side among the two adjacent second to-be-tested margin values found for the first time as the minimum margin value for the first target signal line under the first reference voltage.

6. The semiconductor memory training method according to claim 2, further comprising:
   under the first reference voltage, if it is found for the second time that the test results of the first target signal line at two adjacent first to-be-tested margin values are inconsistent, then searching for, between the two adjacent first to-be-tested margin values found for the second time and according to a third step size, the maximum margin value for the first target signal line under the first reference voltage; and
   wherein the first step size is greater than the third step size.

7. The semiconductor memory training method according to claim 6, wherein said searching for, between the two adjacent first to-be-tested margin values found for the second time and according to a third step size, the maximum margin value for the first target signal line under the first reference voltage comprises:
   starting from the first to-be-tested margin value on a first side among the two adjacent first to-be-tested margin values found for the second time, obtaining a third to-be-tested margin value for the first target signal line under the first reference voltage according to the third step size; and
   under the first reference voltage, if it is found for the first time that the test results of the first target signal line at two adjacent third to-be-tested margin values are inconsistent, then using the third to-be-tested margin value on a first side among the two adjacent third to-be-tested margin values found for the first time as the maximum margin value for the first target signal line under the first reference voltage.

8. The semiconductor memory training method according to claim 6, wherein said searching for, between the two adjacent first to-be-tested margin values found for the second time and according to a third step size, the maximum margin value for the first target signal line under the first reference voltage comprises:
   starting from the first to-be-tested margin value on a second side among the two adjacent first to-be-tested margin values found for the second time, obtaining a third to-be-tested margin value for the first target signal line under the first reference voltage according to the third step size; and
   under the first reference voltage, if it is found for the first time that the test results of the first target signal line at two adjacent third to-be-tested margin values are inconsistent, then using the third to-be-tested margin value on a second side among the two adjacent third to-be-tested margin values found for the first time as a maximum margin value for the first target signal line under the first reference voltage.

9. The semiconductor memory training method according to claim 1, wherein said determining a target interval for an expected margin value according to the first minimum margin value and the second minimum margin value comprises:
   if the second reference voltage is on a first side of the first reference voltage and the first minimum margin value is greater than the second minimum margin value, determining that the target interval is between the first reference voltage and a maximum reference voltage among the plurality of reference voltages.

10. The semiconductor memory training method according to claim 9, wherein said searching for the expected margin value in a target interval comprises:
   starting from the first reference voltage, selecting a first to-be-tested reference voltage within the target interval according to a fourth step size;
   obtaining a measured margin value for the plurality of target signal lines under the first to-be-tested reference voltage, according to a minimum margin value for each target signal line under the first to-be-tested reference voltage;
   if it is found for the first time that there are adjacent first target to-be-tested reference voltage and second target to-be-tested reference voltage among the first to-be-tested reference voltages, and, the measured margin value for the plurality of target signal lines under the first target to-be-tested voltage is greater than the measured margin value for the plurality of target signal lines under the second target to-be-tested voltage, then searching for the expected margin value between the first target to-be-tested voltage and the second target to-be-tested voltage according to a fifth step size;
   wherein the fifth step size is less than the fourth step size.

11. The semiconductor memory training method according to claim 10, wherein said searching for the expected margin value between the first target to-be-tested voltage and the second target to-be-tested voltage according to a fifth step size comprises:
   starting from the first target to-be-tested voltage, selecting a second to-be-tested reference voltage according to the fifth step size;

obtaining a measured margin value for the plurality of target signal lines under the second to-be-tested reference voltage, according to a minimum margin value for each target signal line under the second to-be-tested reference voltage; and if it is found for the first time that there are two adjacent second to-be-tested voltages among the second to-be-tested reference voltages, and the measured margin value for the plurality of target signal lines under the second to-be-tested reference voltage on the first side among the two adjacent second to-be-tested reference voltages is greater than the measured margin value for the plurality of target signal lines under the second to-be-tested voltage on the second side, then, using the measured margin value for the plurality of target signal lines under the second to-be-tested reference voltage on the first side as the expected margin value.

12. The semiconductor memory training method according to claim 11, wherein said searching for the expected margin value between the first target to-be-tested voltage and the second target to-be-tested voltage according to a fifth step size comprises:

if the measured margin value for the plurality of target signal lines under the second to-be-tested reference voltage on the first side among the two adjacent second to-be-tested reference voltages is equal to the measured margin value for the plurality of target signal lines under the second to-be-tested voltage on the second side, then, using the measured margin value for the plurality of target signal lines under the second to-be-tested reference voltage on the second side as the expected margin value; or using the measured margin value for the plurality of target signal lines under an average reference voltage of the two adjacent second to-be-tested reference voltages as the expected margin value.

13. The semiconductor memory training method according to claim 10, wherein said searching for the expected margin value in the target interval further comprises:

if the measured margin value for the plurality of target signal lines under the maximum reference voltage is a maximum value among the measured margin values for the plurality of target signal lines under all first to-be-tested reference voltages, then using the measured margin value for the plurality of target signal lines under the maximum reference voltage as the expected margin value.

14. The semiconductor memory training method according to claim 1, wherein said determining a target interval for an expected margin value according to the first minimum margin value and the second minimum margin value comprises:

if the second reference voltage is on a first side of the first reference voltage and the first minimum margin value is less than the second minimum margin value, determining that the target interval is between the second reference voltage and a minimum reference voltage among the plurality of reference voltages.

15. The semiconductor memory training method according to claim 14, wherein said searching for the expected margin value in the target interval comprises:

starting from the second reference voltage, obtaining a third to-be-tested reference voltage within the target interval according to a sixth step size;

obtaining a measured margin value for the plurality of target signal lines under the third to-be-tested reference voltage, according to a minimum margin value for each target signal line under the third to-be-tested reference voltage;

if it is found for the first time that there are adjacent third target to-be-tested reference voltage and fourth target to-be-tested reference voltage among the third to-be-tested reference voltages, and, the measured margin value for the plurality of target signal lines under the third target to-be-tested voltage is less than the measured margin value for the plurality of target signal lines under the fourth target to-be-tested voltage, then searching for the expected margin value between the third target to-be-tested voltage and the fourth target to-be-tested voltage according to a seventh step size; and wherein the seventh step size is less than the sixth step size.

16. The semiconductor memory training method according to claim 15, wherein said searching for the expected margin value between the third target to-be-tested voltage and the fourth target to-be-tested voltage according to a seventh step size comprises:

starting from the third target to-be-tested voltage, selecting a fourth to-be-tested reference voltage according to the seventh step size;

obtaining a measured margin value for the plurality of target signal lines under the fourth to-be-tested reference voltage, according to a minimum margin value for each target signal line under the fourth to-be-tested reference voltage; and if it is found for the first time that there are two adjacent fourth to-be-tested reference voltages among the fourth to-be-tested reference voltages, and the measured margin value for the plurality of target signal lines under the fourth to-be-tested reference voltage on the first side among the two adjacent fourth to-be-tested reference voltages is less than the measured margin value for the plurality of target signal lines under the fourth to-be-tested voltage on the second side, then, using the measured margin value for the plurality of target signal lines under the fourth to-be-tested reference voltage on the second side as the expected margin value.

17. The semiconductor memory training method according to claim 15, wherein said searching for the expected margin value in the target interval further comprises:

if the measured margin value for the plurality of target signal lines under a last third to-be-tested reference voltage is a maximum value among the measured margin values for the plurality of target signal lines under all third to-be-tested reference voltages, then using the measured margin value for the plurality of target signal lines under the minimum reference voltage as the expected margin value.

18. An electronic device, comprising:

one or more processors; and a storage apparatus, configured to store one or more programs;

the one or more programs cause, when executed by the one or more processors, the one or more processors to implement the method according to claim 1.

19. A computer-readable storage medium having computer programs stored thereon that, when executed by a processor, cause the processor to implement the method according to claim 1.

20. A semiconductor memory training apparatus for a semiconductor memory comprising a plurality of target signal lines, each target signal line having a plurality of reference voltages within a target voltage reference range; wherein the apparatus comprises:
- a reference voltage selection unit, configured to select two adjacent reference voltages from the plurality of reference voltages as a first reference voltage and a second reference voltage;
- a first margin obtaining unit, configured to obtain a first minimum margin value for the plurality of target signal lines under the first reference voltage according to a minimum margin value for each target signal line under the first reference voltage;
- a second margin obtaining unit, configured to obtain a second minimum margin value for the plurality of target signal lines under the second reference voltage according to a minimum margin value for each target signal line under the second reference voltage;
- a target interval determination unit, configured to determine a target interval for an expected margin value according to the first minimum margin value and the second minimum margin value, the expected margin value being a maximum value among the minimum margin values for the plurality of target signal lines under the plurality of reference voltages; and
- an expected margin searching unit, configured to search for the expected margin value in the target interval to determine a reference voltage corresponding to the expected margin value as a training result of the semiconductor memory.

* * * * *